(12) United States Patent
Agrawal et al.

(10) Patent No.: US 12,334,938 B2
(45) Date of Patent: Jun. 17, 2025

(54) DIGITAL FREQUENCY SYNTHESIZER

(71) Applicant: NXP USA, Inc., Austin, TX (US)

(72) Inventors: Gaurav Agrawal, Noida (IN); Deependra Kumar Jain, Noida (IN)

(73) Assignee: NXP USA, Inc., Austin, TX (US)

( * ) Notice: Subject to any disclaimer, the term of this patent is extended or adjusted under 35 U.S.C. 154(b) by 65 days.

(21) Appl. No.: 18/363,017

(22) Filed: Aug. 1, 2023

(65) Prior Publication Data

US 2024/0413825 A1  Dec. 12, 2024

(30) Foreign Application Priority Data

Jun. 6, 2023 (IN) .............................. 202341038764

(51) Int. Cl.
*H03L 7/081* (2006.01)
*H03L 7/083* (2006.01)
*H03L 7/193* (2006.01)

(52) U.S. Cl.
CPC ............ *H03L 7/0818* (2013.01); *H03L 7/083* (2013.01); *H03L 7/193* (2013.01)

(58) Field of Classification Search
CPC ....... H03L 7/0818; H03L 7/083; H03L 7/193; H03L 7/24; H03L 7/06; H03L 7/18; H03L 7/099; H03L 7/0991; H03L 7/0992; H03L 7/0997; H03L 7/0996; H03L 7/0995; H03L 7/1974; H03L 7/1976; H03L 7/1978; H03K 5/133; H03K 5/14; H03K 21/02; H03K 21/00; H03K 21/08; H03K 21/12

See application file for complete search history.

(56) References Cited

U.S. PATENT DOCUMENTS

| | | | |
|---|---|---|---|
| 7,365,580 B2 | 4/2008 | Martin et al. | |
| 7,496,168 B2 | 2/2009 | Leonowich et al. | |
| 7,675,332 B1 | 3/2010 | Kwasniewski et al. | |
| 8,559,587 B1 | 10/2013 | Buell et al. | |
| 8,664,988 B1 | 3/2014 | Xiu | |
| 9,236,873 B1 | 1/2016 | Buell | |
| 2004/0108913 A1* | 6/2004 | Pearce ................. | H03L 7/0805 332/109 |
| 2006/0220697 A1 | 10/2006 | Flynn | |
| 2009/0091362 A1 | 4/2009 | Pellerano et al. | |
| 2023/0170912 A1 | 6/2023 | Lim et al. | |

OTHER PUBLICATIONS

Kumar et al., "Multiphase Digital Frequency Synthesizer With Fractional Division," U.S. Appl. No. 18/296,518, filed Apr. 6, 2023.

* cited by examiner

*Primary Examiner* — Jung Kim

(57) ABSTRACT

A digital frequency synthesizer includes a delay-locked loop (DLL) that generates time-delayed versions of a reference clock signal, a clock divider that executes an integer-division operation on one delayed clock signal to generate an integer-divided clock signal, and control circuitry that generates fractional data for enabling a fractional division. The digital frequency synthesizer further includes a first clock selector that selects one delayed clock signal as a DLL clock signal based on the fractional data, a delay chain that generates time-delayed versions of the DLL clock signal, and a second clock selector that selects one delayed clock signal as a selected clock signal based on the fractional data. A rising edge of the integer-divided clock signal is adjusted based on the selected clock signal to generate a fractional-divided clock signal that is a fractional-divided version of the reference clock signal.

20 Claims, 12 Drawing Sheets

| FD | Fraction | DLLC1 | SLCK1 |
|---|---|---|---|
| 0 | 0 | DC1 | DC9 |
| 1 | 0.05 | DC5 | DC6 |
| 2 | 0.1 | DC4 | DC7 |
| 3 | 0.15 | DC3 | DC8 |
| 4 | 0.2 | DC2 | DC9 |
| 5 | 0.25 | DC1 | DC6 |
| 6 | 0.3 | DC5 | DC7 |
| 7 | 0.35 | DC4 | DC8 |
| 8 | 0.4 | DC3 | DC9 |
| 9 | 0.45 | DC2 | DC6 |
| 10 | 0.5 | DC1 | DC7 |
| 11 | 0.55 | DC5 | DC8 |
| 12 | 0.6 | DC4 | DC9 |
| 13 | 0.65 | DC3 | DC6 |
| 14 | 0.7 | DC2 | DC7 |
| 15 | 0.75 | DC1 | DC8 |
| 16 | 0.8 | DC5 | DC9 |
| 17 | 0.85 | DC4 | DC6 |
| 18 | 0.9 | DC3 | DC7 |
| 19 | 0.95 | DC2 | DC8 |

FIG. 4B

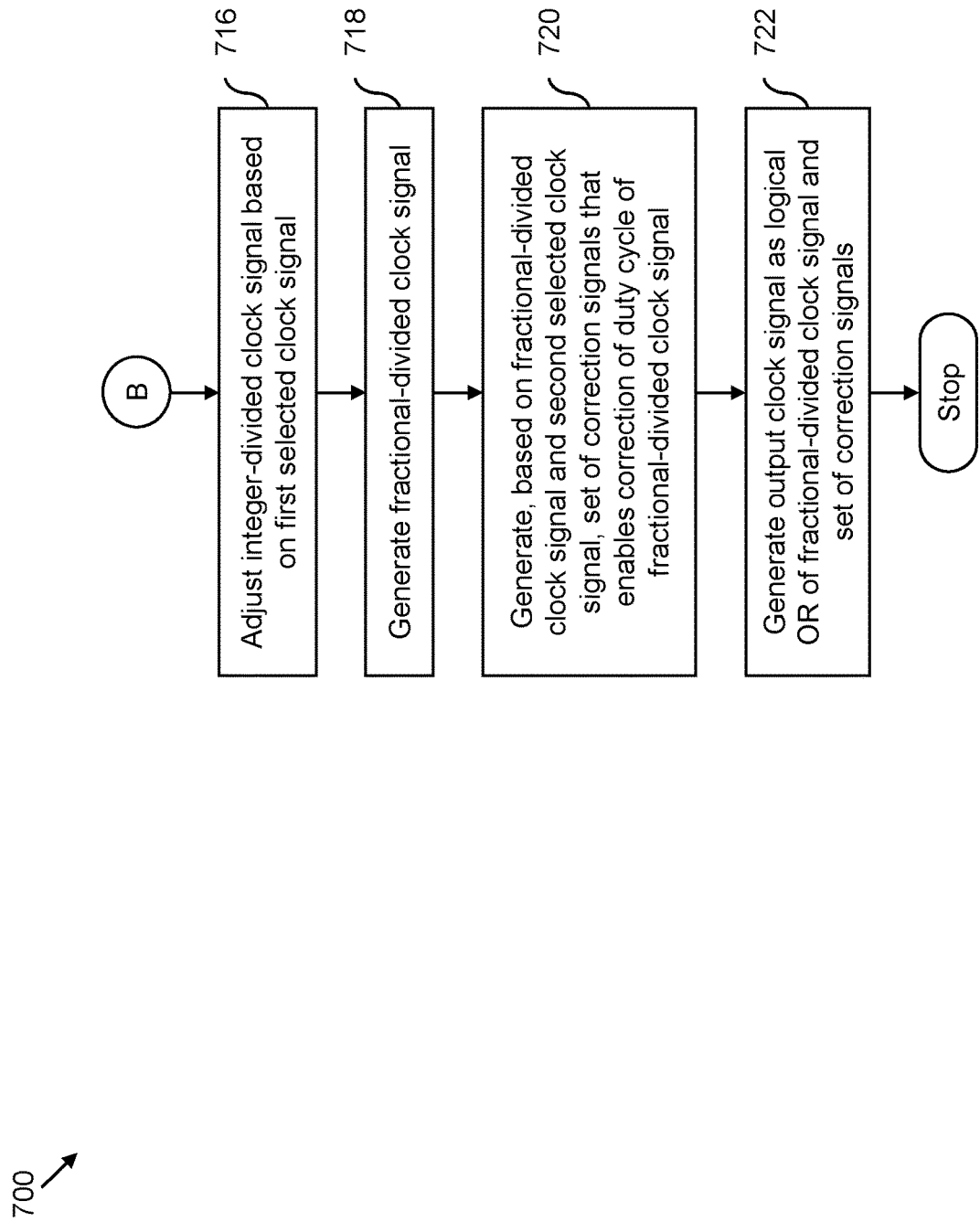

DIGITAL FREQUENCY SYNTHESIZER

CROSS-REFERENCE TO RELATED APPLICATIONS

This application claims the priority under 35 U.S.C. § 119 of India patent application No. 202341038764, filed on 6 Jun. 2023, the contents of which are incorporated by reference herein.

FIELD OF USE

The present disclosure relates generally to electronic circuits, and, more particularly, to a digital frequency synthesizer.

BACKGROUND

Clock generators are used in integrated circuits (ICs) to provide clock signals to various functional circuits of the ICs. The clock frequency requirement of each functional circuit may be different. Hence, digital frequency synthesizers are included in the ICs to divide the clock frequencies generated by the clock generators to values required by various functional circuits. However, the digital frequency synthesizers exclusively execute integer division and the clock frequency requirements of the functional circuits are not always integer-divided versions of the clock frequencies generated by the clock generators. The digital frequency synthesizers are thus unable to meet the clock frequency requirements of such functional circuits.

BRIEF DESCRIPTION OF THE DRAWINGS

The following detailed description of the embodiments of the present disclosure will be better understood when read in conjunction with the appended drawings. The present disclosure is illustrated by way of example, and not limited by the accompanying figures, in which like references indicate similar elements.

FIG. 4B is a table that illustrates the generation of the first selected clock signal for each increment of fractional data in accordance with an embodiment of the present disclosure;

FIGS. 7A and 7B, collectively, represents a flowchart that illustrates a fractional division and duty cycle correction method in accordance with an embodiment of the present disclosure.

DETAILED DESCRIPTION

Figure 1:
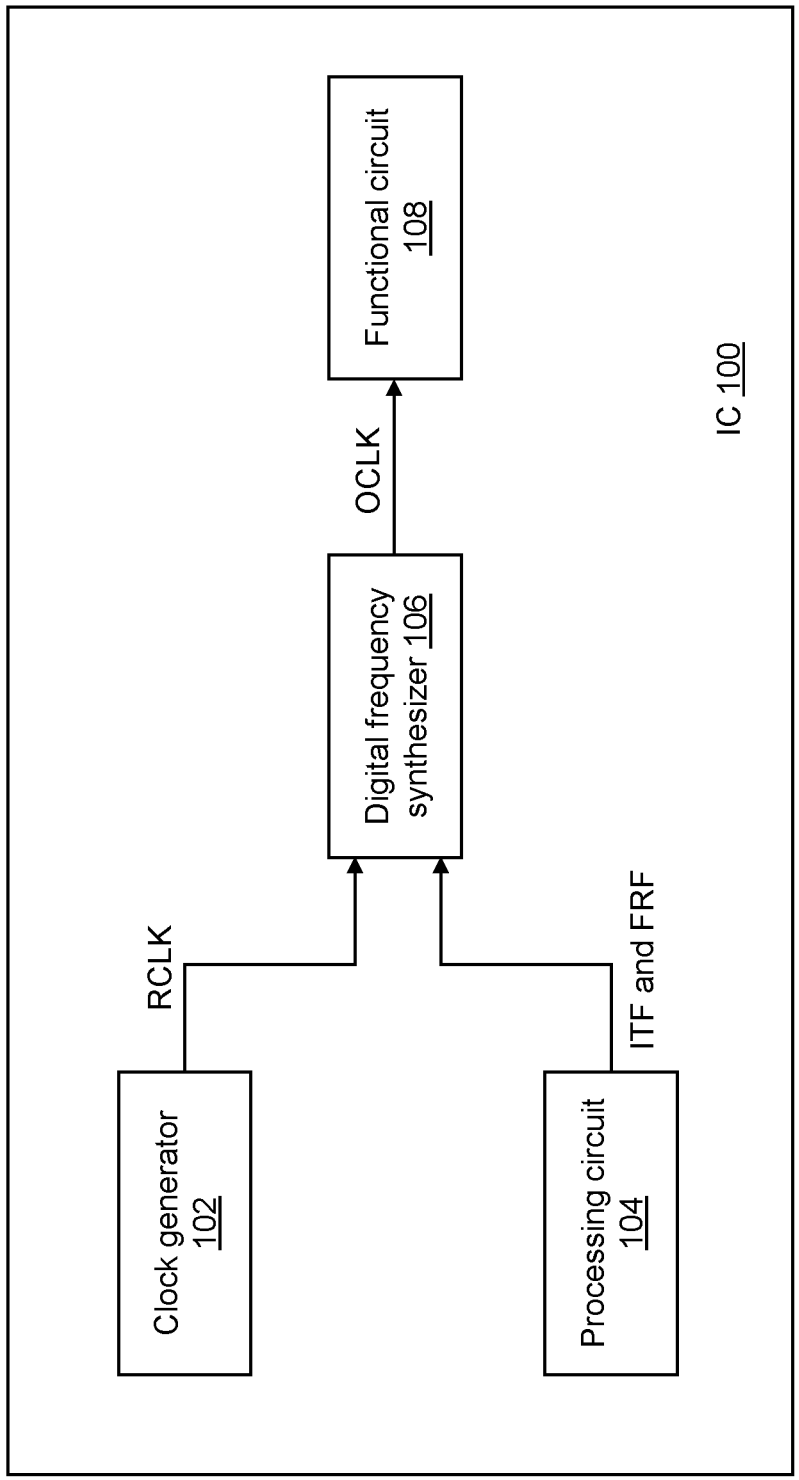
FIG. 1 illustrates a schematic block diagram of an integrated circuit (IC) in accordance with an embodiment of the present disclosure.

The detailed description of the appended drawings is intended as a description of the embodiments of the present disclosure and is not intended to represent the only form in which the present disclosure may be practiced. It is to be understood that the same or equivalent functions may be accomplished by different embodiments that are intended to be encompassed within the spirit and scope of the present disclosure.

Overview:

Conventionally, digital frequency synthesizers executing fractional division are included in integrated circuits (ICs) to generate clock signals that are fractional-divided versions of reference clock signals of the ICs. Such a digital frequency synthesizer includes a voltage-controlled oscillator (VCO) that generates multiple reference clock signals having different phases and an integer divider that generates an integer-divided clock signal which is an integer-divided version of one of the VCO clock signals. Further, for each cycle, one VCO clock signal is utilized for adjusting a rising edge of the integer-divided clock signal to enable fractional division, whereas, a different VCO clock signal is utilized for adjusting a falling edge of the integer-divided clock signal to enable duty cycle correction. The fractional-divided clock signals, having equal to or close to 50% duty cycle, are then utilized to meet the clock frequency requirements of various functional circuits of the ICs.

The resolution of such a digital frequency synthesizer is equal to an inverse of a number of VCO clock signals. For example, if the number of VCO clock signals is five, the resolution of the digital frequency synthesizer is equal to 0.2. The resolution of the digital frequency synthesizer is thus limited. Further, any attempt to increase the resolution of the digital frequency synthesizer (e.g., reduce the value) would require increasing the number of VCO clock signals, which would lead to a significant increase in the complexity of the digital frequency synthesizer. Additionally, the VCO includes a ring oscillator which involves continuous signal switching. As a result, the dynamic power consumption of the digital frequency synthesizer is significant.

Various embodiments of the present disclosure disclose an IC including a digital frequency synthesizer. The digital frequency synthesizer may include a first delay-locked loop (DLL), a clock divider, and control circuitry. The first DLL may receive a reference clock signal and generate a first plurality of delayed clock signals that are time-delayed versions of the reference clock signal. The clock divider may divide a frequency of a first delayed clock signal of the first plurality of delayed clock signals by an integer factor to generate an integer-divided clock signal. Based on the integer-divided clock signal and a fractional factor, the control circuitry may generate fractional data and duty cycle correction data that enable a fractional division and a duty cycle correction associated with the digital frequency synthesizer, respectively.

To enable the fractional division, the digital frequency synthesizer may further include a first clock selector, a first output delay chain, a second clock selector, and a fractional clock generator. The first clock selector may select, based on the fractional data, one of the first plurality of delayed clock signals as a first DLL clock signal, and the first output delay chain may generate a second plurality of delayed clock signals that are time-delayed versions of the first DLL clock signal. Further, based on the fractional data, the second clock selector may select one of the second plurality of delayed clock signals as a first selected clock signal. For each value of the fractional data, the timing of the highs and lows of the first selected clock signal may be different. Further, the fractional clock generator may adjust a rising edge of the integer-divided clock signal based on the first selected clock signal and generate a fractional-divided clock signal that is a fractional-divided version of the reference clock signal. The frequency of the fractional-divided clock signal is equal to a frequency of the reference clock signal divided by a fractional value associated with the fractional division. The fractional value is equal to a sum of the integer factor and a product of the fractional factor and a resolution of the digital frequency synthesizer.

As exclusively the rising edge of the integer-divided clock signal is adjusted, the duty cycle of the fractional-divided clock signal may not be close to 50%. A duty cycle of 50% or close to 50% is a typical requirement for clock signals. Hence, the duty cycle correction is required. The digital frequency synthesizer may further include a third clock selector, a second output delay chain, a fourth clock selector, and a duty cycle corrector. The third clock selector may select, based on the duty cycle correction data, one of the first plurality of delayed clock signals as a second DLL clock signal and the second output delay chain may generate a third plurality of delayed clock signals that are time-delayed versions of the second DLL clock signal. The digital frequency synthesizer may further include a second DLL that controls the operations of the first and second output delay chains. The fourth clock selector may select, based on the duty cycle correction data, one of the third plurality of delayed clock signals as a second selected clock signal. For each value of the duty cycle correction data, the timing of the highs and lows of the second selected clock signal may be different. Further, at any instance, the values of the duty cycle correction data and the fractional data are different. The duty cycle corrector may generate, based on the fractional-divided clock signal and the second selected clock signal, a set of correction signals that enables correction of the duty cycle of the fractional-divided clock signal. Further, an output clock signal of the digital frequency synthesizer is generated based on the fractional-divided clock signal and the set of correction signals. The output clock signal corresponds to the fractional-divided clock signal with the duty cycle thereof adjusted based on the second selected clock signal. The adjusted duty cycle may be equal to or close to 50%.

The conventional digital frequency synthesizer utilizes a VCO (e.g., a ring oscillator) to generate various VCO clock signals and two multiplexers (e.g., clock selectors) to select, based on fractional and duty cycle correction data, two different VCO clock signals for adjusting the rising and falling edges of an integer-divided clock signal to enable the fractional division and the duty cycle correction, respectively. The digital frequency synthesizer of the present disclosure, on the other hand, utilizes a combination of two DLLs, two output delay chains, and four clock selectors to generate the first and second selected clock signals (e.g., clock signals that are utilized for adjusting the rising and falling edges of the integer-divided clock signal to enable the fractional division and the duty cycle correction, respectively). The digital frequency synthesizer of the present disclosure is thus different from the conventional digital frequency synthesizer.

The utilization of DLLs and output delay chains over a VCO has numerous advantages. In the present disclosure, the resolution of the digital frequency synthesizer is equal to an inverse of a product of a number of delayed clock signals of the first plurality of delayed clock signals (e.g., a number of delay elements of the first DLL) and a number of delayed clock signals of the second plurality of delayed clock signals (e.g., a number of delay elements of the first output delay chain or a number of delay elements of the second DLL). For example, if the first plurality of delayed clock signals include five clock signals and the second plurality of delayed clock signals include four clock signals, the resolution of the digital frequency synthesizer of the present disclosure is equal to 0.05 (e.g., 1÷20). Thus, a resolution of 0.05 may be achieved by utilizing exclusively nine clock signals (e.g., five original phases). In contrast, the conventional digital frequency synthesizer would require 20 clock signals to achieve a resolution of 0.05, as the resolution of the conventional digital frequency synthesizer is equal to an inverse of a number of VCO clock signals. Thus, the complexity of the digital frequency synthesizer of the present disclosure is significantly less than that of the conventional digital frequency synthesizer for achieving a similar resolution. Further, the digital frequency synthesizer of the present disclosure utilizes DLLs and delay chains to generate the clock signals, whereas, the conventional digital frequency synthesizer utilizes a ring oscillator. Thus, the dynamic power consumption of the digital frequency synthesizer of the present disclosure is significantly less than that of the conventional digital frequency synthesizer.

FIG. 1 illustrates a schematic block diagram of an integrated circuit (IC) 100 in accordance with an embodiment of the present disclosure. The IC 100 may include a clock generator 102, a processing circuit 104, a digital frequency synthesizer 106, and a functional circuit 108. The IC 100 may be utilized in various applications such as an automotive device, a networking device, a radio receiver, a global positioning system (GPS) system, an audio/video device, a satellite receiver, or the like.

The clock generator 102 may include suitable circuitry configured to perform one or more operations. For example, the clock generator 102 may be configured to generate a reference clock signal RCLK. Examples of the clock generator 102 may include a crystal oscillator, a phased-locked loop, a resistance-capacitance (RC) oscillator, a programmable clock generator, or the like.

The processing circuit 104 may include suitable circuitry configured to perform one or more operations. For example, the processing circuit 104 may be configured to generate an integer factor ITF and a fractional factor FRF. The integer factor ITF may be an integer value that facilitates an integer division of the reference clock signal RCLK. In an embodiment, the integer factor ITF may be an 8-bit value ranging from 2 to 255. However, in other embodiments, the integer factor ITF may have a different range and/or a different number of bits. The fractional factor FRF may also be an integer value that facilitates a fractional division of the reference clock signal RCLK. The fractional factor FRF may be less than an inverse of a resolution of the digital frequency synthesizer 106. The resolution of the digital frequency synthesizer 106 may refer to the smallest frequency step that can be generated in an output of the digital frequency synthesizer 106. In an embodiment, the resolution of the digital frequency synthesizer 106 is equal to 0.05. Thus, the fractional factor FRF may be a 5-bit value ranging from 0 to 19. However, in other embodiments, the fractional factor FRF may have a different range and/or a different number of bits.

The digital frequency synthesizer 106 may be coupled to the clock generator 102 and the processing circuit 104. The digital frequency synthesizer 106 may include suitable circuitry configured to perform one or more operations. For example, the digital frequency synthesizer 106 may be configured to receive the reference clock signal RCLK from the clock generator 102 and the integer and fractional factors ITF and FRF from the processing circuit 104. The digital frequency synthesizer 106 may be further configured to generate an output clock signal OCLK based on the reference clock signal RCLK, the integer factor ITF, and the fractional factor FRF.

To generate the output clock signal OCLK, the digital frequency synthesizer 106 may execute various operations. For example, the digital frequency synthesizer 106 may be configured to generate a first plurality of delayed clock signals that are time-delayed versions of the reference clock signal RCLK. Further, the digital frequency synthesizer 106 may be configured to divide a frequency of a first delayed clock signal of the first plurality of delayed clock signals by the integer factor ITF to generate an integer-divided clock signal. Based on the integer-divided clock signal and the fractional factor FRF, the digital frequency synthesizer 106 may be further configured to generate fractional data and duty cycle correction data that enable a fractional division and a duty cycle correction associated with the digital frequency synthesizer 106, respectively.

Based on the fractional data, the digital frequency synthesizer 106 may be further configured to generate a second plurality of delayed clock signals that are time-delayed versions of one of the first plurality of delayed clock signals and select one of the second plurality of delayed clock signals for adjusting a rising edge of the integer-divided clock signal. The adjustment of the rising edge results in the generation of a fractional-divided clock signal that is a fractional-divided version of the reference clock signal RCLK. Further, based on the duty cycle correction data, the digital frequency synthesizer 106 may be configured to generate a third plurality of delayed clock signals that are time-delayed versions of one of the first plurality of delayed clock signals and select one of the third plurality of delayed clock signals for generating, in conjunction with the fractional-divided clock signal, a set of correction signals that enables correction of a duty cycle of the fractional-divided clock signal. The correction of the duty cycle of the fractional-divided clock signal corresponds to adjusting a falling edge of the fractional-divided clock signal such that the duty cycle is equal to 50% or close to 50% (e.g., within a predefined limit of 50%). The predefined limit may correspond to a range of ±10%. However, in other embodiments, the predefined limit may have other values. All the aforementioned signals and data are illustrated further in FIGS. 2, 3, and 5.

The output clock signal OCLK is thus a fractional-divided version of the reference clock signal RCLK with a duty cycle thereof adjusted to be equal to 50% or close to 50%. Thus, the frequency of the output clock signal OCLK is equal to a frequency of the reference clock signal RCLK divided by a fractional value associated with the fractional division. The fractional value is equal to a sum of the integer factor ITF and a product of the fractional factor FRF and the resolution of the digital frequency synthesizer 106. The product of the fractional factor FRF and the resolution of the digital frequency synthesizer 106 is a decimal value that ranges between zero and one.

In an example, if the frequency of the reference clock signal RCLK is 8 gigahertz (GHz), the integer factor ITF is 4, the fractional factor FRF is 6, and the resolution is 0.05, 8 GHz (e.g., the reference clock signal RCLK) is divided by 4.3 and the frequency of the output clock signal OCLK is 1.86 GHz. In such a scenario, the ON-time of the fractional-divided clock signal is equal to twice the time period of the reference clock signal RCLK, whereas, the OFF-time of the fractional-divided clock signal is equal to 2.3 times the time period of the reference clock signal RCLK. As exclusively the rising edge is adjusted for the fractional division, the duty cycle of the fractional-divided clock signal is not close to 50%. Hence, the set of correction signals may further adjust the falling edge of the fractional-divided clock signal such that the ON-time of the output clock signal OCLK is equal to 2.15 times the time period of the reference clock signal RCLK and the OFF-time of the output clock signal OCLK is equal to 2.15 times the time period of the reference clock signal RCLK.

The functional circuit 108 may be coupled to the digital frequency synthesizer 106. The functional circuit 108 may include suitable circuitry configured to perform one or more operations. For example, the functional circuit 108 may be configured to receive the output clock signal OCLK from the digital frequency synthesizer 106. Based on the output clock signal OCLK, the functional circuit 108 may be further configured to execute one or more operations thereof. Examples of the functional circuit 108 may include a digital signal processor, a math accelerator, a core circuit, or the like.

Figure 2:
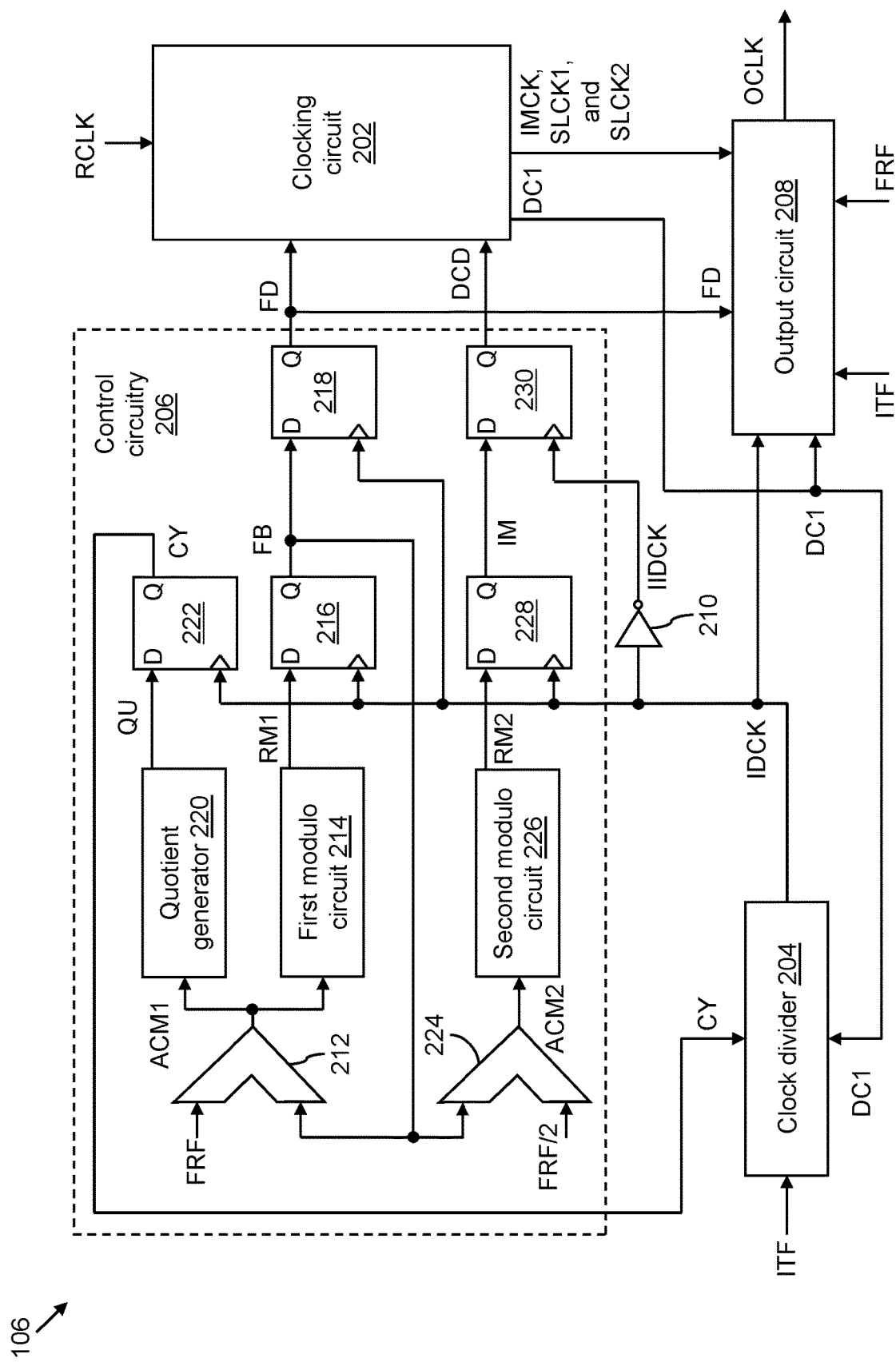
FIG. 2 illustrates a schematic block diagram of a digital frequency synthesizer of the IC of FIG. 1 in accordance with an embodiment of the present disclosure.

FIG. 2 illustrates a schematic block diagram of the digital frequency synthesizer 106 in accordance with an embodiment of the present disclosure. The digital frequency synthesizer 106 may include a clocking circuit 202, a clock divider 204, control circuitry 206, and an output circuit 208.

The clocking circuit 202 may generate time-delayed versions of the reference clock signal RCLK (e.g., the first plurality of delayed clock signals), one of which is utilized as a reference for the fractional division and the duty cycle correction. The clock divider 204 may divide the frequency of one time-delayed clock signal by the integer factor ITF to generate the integer-divided clock signal (hereinafter referred to and designated as the "integer-divided clock signal IDCK"). The control circuitry 206 utilizes the integer-divided clock signal IDCK and the fractional factor FRF to generate fractional data and duty cycle correction data (hereinafter referred to and designated as the "fractional and duty cycle correction data FD and DCD") for controlling the fractional division and the duty cycle correction associated with the digital frequency synthesizer 106, respectively. The clocking circuit 202 may utilize the fractional data FD and the duty cycle correction data DCD generated by the control circuitry 206 to derive two different clock signals from the time-delayed versions of the reference clock signal RCLK. The output circuit 208 may utilize the two clock signals generated by the clocking circuit 202 to adjust the rising and falling edges of the integer-divided clock signal IDCK and generate the output clock signal OCLK that is a fractional-divided version of the reference clock signal RCLK with the duty cycle thereof adjusted to be equal to 50% or close to 50%. The clocking circuit 202, the clock divider 204, the control circuitry 206, and the output circuit 208 are further explained below.

The clocking circuit 202 may be coupled to the clock generator 102. The clocking circuit 202 may be configured to receive the reference clock signal RCLK from the clock generator 102 and generate the first plurality of delayed clock signals that are time-delayed versions of the reference clock signal RCLK. In one embodiment, the first plurality of delayed clock signals include five delayed clock signals. However, in other embodiments, the number of delayed clock signals of the first plurality of delayed clock signals may be less than or more than five. Further, a delay between a last delayed clock signal of the first plurality of delayed clock signals and the reference clock signal RCLK is equal to the time period of the reference clock signal RCLK. Further, the first plurality of delayed clock signals are equidistant. Thus, the delay between adjacent delayed clock signals is equal to 0.2T, where 'T' corresponds to the time period of the reference clock signal RCLK. The clocking circuit 202 may be further configured to generate the second and third pluralities of delayed clock signals which are time-delayed versions of the same delayed clock signal or two different delayed clock signals of the first plurality of delayed clock signals. Further, the clocking circuit 202 may be configured to select one of the second plurality of delayed clock signals as a first selected clock signal SLCK1 to enable the fractional division. Similarly, the clocking circuit 202 may be further configured to select one of the third plurality of delayed clock signals as a second selected clock signal SLCK2 to enable the duty cycle correction. The clocking circuit 202 is explained in detail in conjunction with FIG. 3.

The clock divider 204 may be coupled to the clocking circuit 202, the control circuitry 206, and the processing circuit 104. The clock divider 204 may include suitable circuitry configured to perform one or more operations. For example, the clock divider 204 may be configured to receive the first delayed clock signal (hereinafter referred to and designated as the "first delayed clock signal DC1") from the clocking circuit 202, the integer factor ITF from the processing circuit 104, and a carry bit CY from the control circuitry 206. The carry bit CY may correspond to a 1 (e.g., an asserted state) or a 0 (e.g., a de-asserted state). Further, based on the integer factor ITF and the carry bit CY, the clock divider 204 may be configured to execute an integer-division operation on the first delayed clock signal DCI to generate the integer-divided clock signal IDCK. In an embodiment, the execution of the integer-division operation on the first delayed clock signal DCI corresponds to a division of a frequency of the first delayed clock signal DC1 by a sum of the integer factor ITF and the carry bit CY. Thus, when the carry bit CY is 0, the execution of the integer-division operation on the first delayed clock signal DC1 corresponds to the division of the frequency of the first delayed clock signal DC1 by the integer factor ITF. The integer-divided clock signal IDCK is thus an integer-divided version of the reference clock signal RCLK. In an embodiment, the clock divider 204 is implemented using a binary counter. However, in other embodiments, the clock divider 204 may be implemented in a different manner.

The digital frequency synthesizer 106 may further include a first inverter 210 that may be coupled to the clock divider 204. The first inverter 210 may be configured to receive the integer-divided clock signal IDCK from the clock divider 204 and generate an inverted integer-divided clock signal IIDCK that is an inverted version of the integer-divided clock signal IDCK.

The control circuitry 206 may be coupled to the processing circuit 104, the clock divider 204, the first inverter 210, and the clocking circuit 202. The control circuitry 206 may be configured to receive the fractional factor FRF from the processing circuit 104, the integer-divided clock signal IDCK from the clock divider 204, and the inverted integer-divided clock signal IIDCK from the first inverter 210. Based on the fractional factor FRF and the integer-divided clock signal IDCK, the control circuitry 206 may be further configured to generate the carry bit CY and the fractional data FD. The fractional data FD enables the fractional division associated with the digital frequency synthesizer 106. In an embodiment, the fractional data FD corresponds to a 5-bit value ranging from 0 to 19. However, in other embodiments, the fractional data FD may have a different range and/or a different number of bits. Further, based on the fractional factor FRF, the integer-divided clock signal IDCK, and the inverted integer-divided clock signal IIDCK, the control circuitry 206 may be configured to generate the duty cycle correction data DCD. The duty cycle correction data DCD enables the duty cycle correction associated with the digital frequency synthesizer 106. In an embodiment, the duty cycle correction data DCD corresponds to a 5-bit value ranging from 0 to 19. However, in other embodiments, the duty cycle correction data DCD may have a different range and/or a different number of bits.

The control circuitry 206 may be further configured to provide the fractional data FD and the duty cycle correction data DCD to the clocking circuit 202. The clocking circuit 202 may select the first and second selected clock signals SLCK1 and SLCK2 based on the fractional data FD and the duty cycle correction data DCD, respectively. The control circuitry 206 may include a first accumulator 212, a first modulo circuit 214, a first synchronizer 216, a second synchronizer 218, a quotient generator 220, a third synchronizer 222, a second accumulator 224, a second modulo circuit 226, a fourth synchronizer 228, and a fifth synchronizer 230.

The first accumulator 212 may be coupled to the processing circuit 104 and the first synchronizer 216. The first accumulator 212 may include suitable circuitry configured to perform one or more operations. For example, the first accumulator 212 may be configured to receive the fractional factor FRF from the processing circuit 104 and feedback data FB from the first synchronizer 216. The fractional factor FRF may be an integer value ranging between 0 to 19. Similarly, in one embodiment, the feedback data FB corresponds to a 5-bit value ranging between 0 to 19. However, in other embodiments, the feedback data FB may have a different range and/or a different number of bits. The first accumulator 212 may be further configured to generate first accumulated data ACM1 based on the fractional factor FRF and the feedback data FB. In an embodiment, the first accumulated data ACM1 corresponds to a sum of the fractional factor FRF and the feedback data FB.

Fractional Division:

The first modulo circuit 214 may be coupled to the first accumulator 212. The first modulo circuit 214 may include suitable circuitry configured to perform one or more operations. For example, the first modulo circuit 214 may be configured to receive the first accumulated data ACM1 from the first accumulator 212, execute a first modulo operation on the first accumulated data ACM1, and generate a first remainder value RM1. A divisor of the first modulo operation may correspond to the inverse of the resolution of the digital frequency synthesizer 106. In one embodiment, the first remainder value RM1 corresponds to a 5-bit value ranging between 0 to 19. However, in other embodiments, the first remainder value RM1 may have a different range and/or a different number of bits.

The first synchronizer 216 may be coupled to the first modulo circuit 214 and the clock divider 204. The first synchronizer 216 may include suitable circuitry configured to perform one or more operations. For example, the first synchronizer 216 may be configured to receive the first remainder value RM1 from the first modulo circuit 214 and the integer-divided clock signal IDCK from the clock divider 204. Further, the first synchronizer 216 may be configured to sample the first remainder value RM1 based on the integer-divided clock signal IDCK to generate the feedback data FB. In an embodiment, the first synchronizer 216 may include multiple D-flip-flops (e.g., 5 D-flip-flops for 5 bits each of the first remainder value RM1 and the feedback data FB).

The second synchronizer 218 may be coupled to the first synchronizer 216 and the clock divider 204. The second synchronizer 218 may include suitable circuitry configured to perform one or more operations. For example, the second synchronizer 218 may be configured to receive the feedback data FB from the first synchronizer 216 and the integer-divided clock signal IDCK from the clock divider 204. Further, the second synchronizer 218 may be configured to sample the feedback data FB based on the integer-divided clock signal IDCK to generate the fractional data FD. In an embodiment, the second synchronizer 218 may include multiple D-flip-flops.

Carry Generation:

The quotient generator 220 may be coupled to the first accumulator 212. The quotient generator 220 may include suitable circuitry configured to perform one or more operations. For example, the quotient generator 220 may be configured to receive the first accumulated data ACM1 from the first accumulator 212. Further, the quotient generator 220 may be configured to divide the first accumulated data ACM1 by the inverse of the resolution of the digital frequency synthesizer 106 and generate a quotient value QU. The quotient value QU may be a single bit value.

The third synchronizer 222 may be coupled to the quotient generator 220 and the clock divider 204. The third synchronizer 222 may include suitable circuitry configured to perform one or more operations. For example, the third synchronizer 222 may be configured to receive the quotient value QU from the quotient generator 220 and the integer-divided clock signal IDCK from the clock divider 204. Further, the third synchronizer 222 may be configured to sample the quotient value QU based on the integer-divided clock signal IDCK to generate the carry bit CY. In an embodiment, the third synchronizer 222 corresponds to a D-flip-flop. The third synchronizer 222 may be further configured to provide the carry bit CY to the clock divider 204 to facilitate the integer division of the first delayed clock signal DC1.

The fractional data FD and the carry bit CY are generated in an iterative manner. For each iteration, the carry bit CY may be asserted or de-asserted, whereas, the value of the fractional data FD is maintained below the inverse of the resolution of the digital frequency synthesizer 106 (e.g., maintained below 20). Initially, the feedback data FB and the fractional data FD are equal to 0 and the fractional factor FRF is assumed to be equal to 8. Thus, the first accumulator 212 adds 0 and 8 and the first accumulated data ACM1 is equal to 8. The first modulo circuit 214 then performs 8 modulo 20 (e.g., the first modulo operation) and the first remainder value RM1 is equal to 8. Simultaneously, the quotient generator 220 may divide 8 by 20 and the quotient value QU is equal to 0 (e.g., is de-asserted). At the next rising edge of the integer-divided clock signal IDCK, the feedback data FB is equal to 8, the fractional data FD remains 0, the carry bit CY is de-asserted, the first accumulated data ACM1 is equal to 16 (e.g., 8+8), the first remainder value RM1 is equal to 16, and the quotient value QU is equal to 0 (e.g., is de-asserted). Similarly, at the next rising edge, the feedback data FB is equal to 16, the fractional data FD is equal to 8, the carry bit CY is de-asserted, the first accumulated data ACM1 is equal to 24 (e.g., 8+16), the first remainder value RM1 is equal to 4, and the first quotient value QU is equal to 1 (e.g., is asserted). As a result, at the next rising edge of the integer-divided clock signal IDCK, the feedback data FB is equal to 4, the fractional data FD is equal to 16, the carry bit CY is asserted, the first accumulated data ACM1 is equal to 12 (e.g., 8+4), the first remainder value RM1 is equal to 12, and the quotient value QU is equal to 0 (e.g., is de-asserted).

Operation continues in an afore-mentioned manner so that in successive cycles of the integer-divided clock signal IDCK, the pattern of the feedback data FB is 0, 8, 16, 4, 12, 0, 8, 16, 4, 12, and so on. The fractional data FD has a similar pattern as the feedback data FB but is delayed by one cycle of the integer-divided clock signal IDCK. Thus, the pattern of the fractional data FD is 0, 0, 8, 16, 4, 12, 0, 8, 16, 4, 12, and so on. In conclusion, barring an initial cycle, the fractional data FD is incremented by the fractional factor FRF in each successive cycle and the first modulo operation causes the values to wrap around the possible values of 0 to 19 corresponding to the inverse of the resolution of the digital frequency synthesizer 106. Operation is similar for different values of the fractional factor FRF with a correspondingly different increment. For example, for the fractional factor FRF of 5, the pattern of the fractional data FD may be 0, 0, 5, 10, 15, 0, 5, 10, and so on.

Duty Cycle Correction:

The second accumulator 224 may be coupled to the first synchronizer 216. The second accumulator 224 may include suitable circuitry configured to perform one or more operations. For example, the second accumulator 224 may be configured to receive the feedback data FB from the first synchronizer 216. Further, the second accumulator 224 may be configured to receive a right-shifted version of the fractional factor FRF. The right-shifted version of the fractional factor FRF (e.g., FRF/2) corresponds to a logical half of the fractional factor FRF (hereinafter referred to as the "half fractional factor FRF/2"). The control circuitry 206 may further include a right-shift circuit (not shown) that may be coupled to the processing circuit 104 and the second accumulator 224, and configured to receive the fractional factor FRF from the processing circuit 104 and generate and provide the half fractional factor FRF/2 to the second accumulator 224. The fractional portion of the half fractional factor FRF/2 is truncated and discarded. For example, if the fractional factor FRF is 3, the half fractional factor FRF/2 is 1 (rather than 1.5). The second accumulator 224 may be further configured to generate second accumulated data ACM2 based on the half fractional factor FRF/2 and the feedback data FB. In an embodiment, the second accumulated data ACM2 corresponds to a sum of the half fractional factor FRF/2 and the feedback data FB.

The second modulo circuit 226 may be coupled to the second accumulator 224. The second modulo circuit 226 may include suitable circuitry configured to perform one or more operations. For example, the second modulo circuit 226 may be configured to receive the second accumulated data ACM2 from the second accumulator 224. Further, the second modulo circuit 226 may be configured to execute a second modulo operation on the second accumulated data ACM2 and generate a second remainder value RM2. A divisor of the second modulo operation may correspond to the inverse of the resolution of the digital frequency synthesizer 106 (e.g., 20). In one embodiment, the second remainder value RM2 corresponds to a 5-bit value ranging between 0 to 19. However, in other embodiments, the second remainder value RM2 may have a different range and/or a different number of bits.

The fourth synchronizer 228 may be coupled to the second modulo circuit 226 and the clock divider 204. The fourth synchronizer 228 may include suitable circuitry configured to perform one or more operations. For example, the fourth synchronizer 228 may be configured to receive the second remainder value RM2 from the second modulo circuit 226 and the integer-divided clock signal IDCK from the clock divider 204. Further, the fourth synchronizer 228 may be configured to sample the second remainder value RM2 based on the integer-divided clock signal IDCK to generate intermediate data IM. In one embodiment, the intermediate data IM corresponds to a 5-bit value ranging between 0 to 19. However, in other embodiments, the intermediate data IM may have a different range and/or a different number of bits. Further, the fourth synchronizer 228 may include multiple D-flip-flops.

The fifth synchronizer 230 may be coupled to the fourth synchronizer 228 and the first inverter 210. The fifth synchronizer 230 may include suitable circuitry configured to perform one or more operations. For example, the fifth synchronizer 230 may be configured to receive the intermediate data IM from the fourth synchronizer 228 and the inverted integer-divided clock signal IIDCK from the first inverter 210. Further, the fifth synchronizer 230 may be configured to sample the intermediate data IM based on the inverted integer-divided clock signal IIDCK to generate the duty cycle correction data DCD. In one embodiment, the duty cycle correction data DCD corresponds to a 5-bit value ranging between 0 to 19. However, in other embodiments, the duty cycle correction data DCD may have a different range and/or a different number of bits. Further, the fifth synchronizer 230 may include multiple D-flip-flops.

The duty cycle correction data DCD is generated in an iterative manner, and for each iteration, the value of the duty cycle correction data DCD is maintained below the inverse of the resolution of the digital frequency synthesizer 106 (e.g., maintained below 20). Initially, the feedback data FB, the intermediate data IM, and the duty cycle correction data DCD are equal to 0 and the half fractional factor FRF/2 is equal to 4. Thus, the second accumulator 224 adds 0 and 4 and the second accumulated data ACM2 is equal to 4. The second modulo circuit 226 then performs 4 modulo 20 (e.g., the second modulo operation) and the second remainder value RM2 is equal to 4. In the next cycle of the integer-divided clock signal IDCK, the feedback data FB is equal to 8, the intermediate data IM is equal to 4, the duty cycle correction data DCD remains 0, the second accumulated data ACM2 is equal to 12 (e.g., 8+4), and the second remainder value RM2 is equal to 12. Similarly, in the next cycle, the feedback data FB is equal to 16, the intermediate data IM is equal to 12, the duty cycle correction data DCD is equal to 4, the second accumulated data ACM2 is equal to 20 (e.g., 16+4), and the second remainder value RM2 is equal to 0. Further, in the next cycle of the integer-divided clock signal IDCK, the feedback data FB is equal to 4, the intermediate data IM is equal to 0, the duty cycle correction data DCD is equal to 12, the second accumulated data ACM2 is equal to 8 (e.g., 4+4), and the second remainder value RM2 is equal to 8.

Operation continues in an afore-mentioned manner so that in successive cycles of the integer-divided clock signal IDCK, the pattern of the duty cycle correction data DCD is 0, 0, 4, 12, 0, 8, 16, 4, 12, and so on. Operation is similar for different values of the half fractional factor FRF/2 with a correspondingly different increment.

The varying values of the fractional data FD and the duty cycle correction data DCD ensure that the first and second selected clock signals SLCK1 and SLCK2 are not identical for two successive clock cycles. Thus, the time period of each of the first and second selected clock signals SLCK1 and SLCK2 is different from that of the reference clock signal RCLK. Such first and second selected clock signals SLCK1 and SLCK2 are then utilized to generate the output clock signal OCLK. Further, the fractional data FD and the duty cycle correction data DCD are generated in synchronization with the rising and falling edges of the integer-divided clock signal IDCK to enable adjustment of the rising and falling edges of the integer-divided clock signal IDCK, respectively.

The output circuit 208 may be coupled to the control circuitry 206 (e.g., the second synchronizer 218), the clock divider 204, the clocking circuit 202, and the processing circuit 104. The output circuit 208 may be configured to receive the integer-divided clock signal IDCK from the clock divider 204, the integer and fractional factors ITF and FRF from the processing circuit 104, and the fractional data FD from the second synchronizer 218. Further, the output circuit 208 may be configured to receive the first delayed clock signal DC1, an intermediate delayed clock signal IMCK, the first selected clock signal SLCK1, and the second selected clock signal SLCK2 from the clocking circuit 202. The intermediate delayed clock signal IMCK may correspond to one of the first plurality of delayed clock signals that is different from the first delayed clock signal DC1. Based on the integer-divided clock signal IDCK, the integer and fractional factors ITF and FRF, the fractional data FD, the first delayed clock signal DC1, the intermediate delayed clock signal IMCK, the first selected clock signal SLCK1, and the second selected clock signal SLCK2, the output circuit 208 may be configured to generate the output clock signal OCLK. The output circuit 208 is explained in detail in conjunction with FIG. 5.

The number of bits of each of the fractional factor FRF, the first and second remainder values RM1 and RM2, the feedback data FB, the intermediate data IM, the fractional data FD, and the duty cycle correction data DCD is determined based on the inverse of the resolution of the digital frequency synthesizer 106. For example, if the resolution is 0.05, the inverse of the resolution is 20 which may be digitally defined using 5 bits. If the inverse of the resolution is increased to 30, for example, all the aforementioned data may still be defined using 5 bits. Further reduction in the resolution value may lead to an increase in the number of bits.

In the present disclosure, the first delayed clock signal DC1 is used as a reference to ensure the stability of operation (e.g., as the reference clock signal RCLK is generated external to the digital frequency synthesizer 106). However, the scope of the present disclosure is not limited to it. In other embodiments, any other clock signal (e.g., the reference clock signal RCLK or a different delayed clock signal of the first plurality of delayed clock signals) may be utilized as the reference, without deviating from the scope of the present disclosure.

Figure 3:
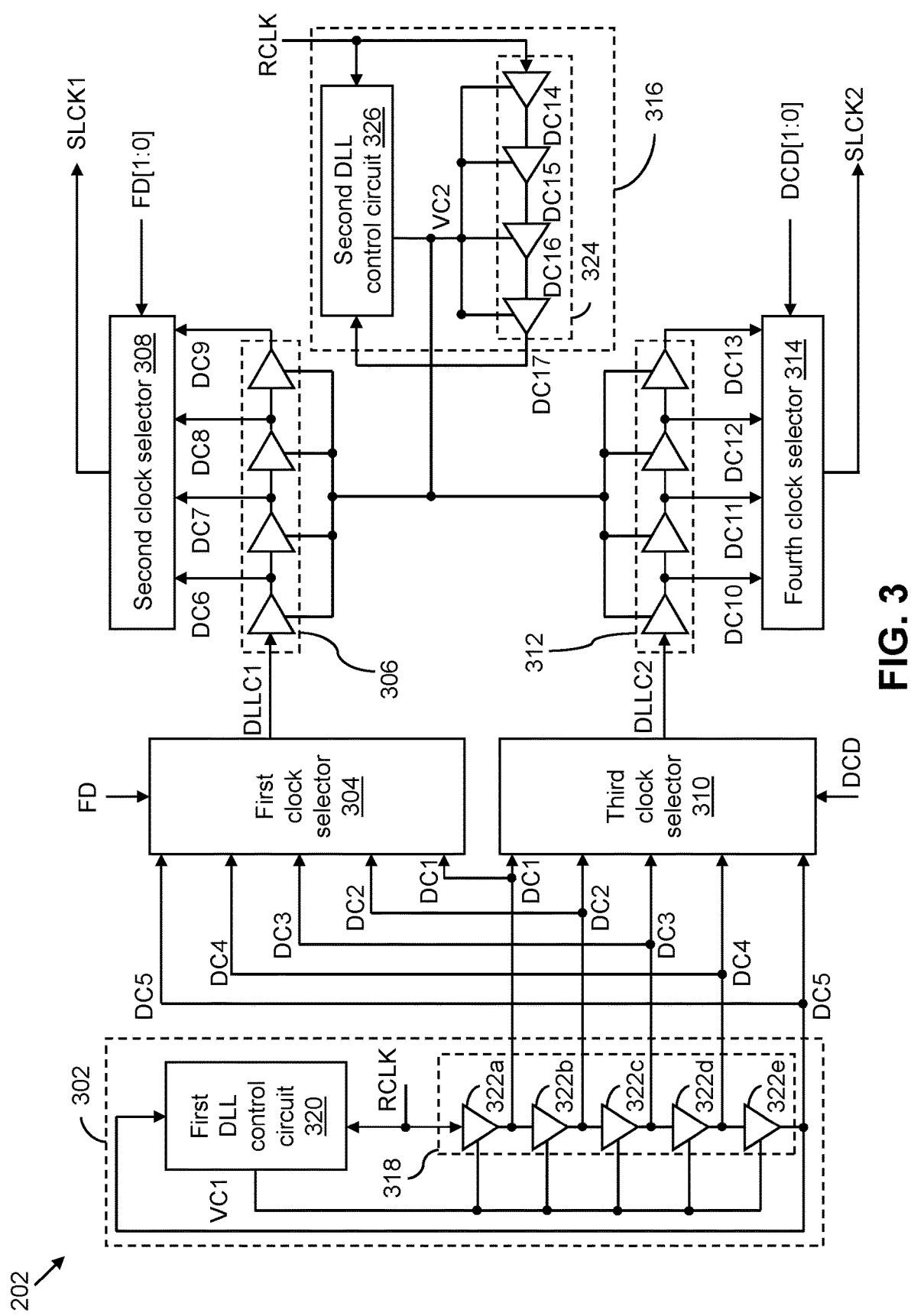
FIG. 3 illustrates a schematic block diagram of a clocking circuit of the digital frequency synthesizer of FIG. 2 in accordance with an embodiment of the present disclosure.

FIG. 3 illustrates a schematic block diagram of the clocking circuit 202 in accordance with an embodiment of the present disclosure. The clocking circuit 202 includes a first delay-locked loop (DLL) 302, a first clock selector 304, a first output delay chain 306, a second clock selector 308, a third clock selector 310, a second output delay chain 312, a fourth clock selector 314, and a second DLL 316.

The first DLL 302 may be coupled to the clock generator 102. The first DLL 302 may be configured to receive the reference clock signal RCLK from the clock generator 102 and generate the first plurality of delayed clock signals. As illustrated in FIG. 3, the first plurality of delayed clock signals include five delayed clock signals, namely, the first delayed clock signal DC1 and second through fifth delayed clock signals DC2-DC5. The first plurality of delayed clock signals (hereinafter referred to and designated as the "first plurality of delayed clock signals DC1-DC5") are the time-delayed versions of the reference clock signal RCLK. The first DLL 302 may include a first DLL delay chain 318 and a first DLL control circuit 320.

The first DLL delay chain 318 may be coupled to the clock generator 102 and the first DLL control circuit 320. The first DLL delay chain 318 may be configured to receive the reference clock signal RCLK from the clock generator 102 and a first control voltage VC1 from the first DLL control circuit 320. Based on the reference clock signal RCLK and the first control voltage VC1, the first DLL delay chain 318 may be configured to generate the first plurality of delayed clock signals DC1-DC5. The first DLL delay chain 318 may include a first plurality of series-coupled delay elements that are configured to generate the first plurality of delayed clock signals DC1-DC5 such that a delay introduced by each delay element is identical. The first plurality of series-coupled delay elements may include first through fifth delay elements 322a-322e that are coupled in series, and configured to generate the first through fifth delayed clock signals DC1-DC5, respectively.

The first DLL control circuit 320 may be coupled to the clock generator 102 and the first DLL delay chain 318. The first DLL control circuit 320 may be configured to receive the reference clock signal RCLK from the clock generator 102 and the fifth delayed clock signal DC5 (e.g., a last delayed clock signal of the first plurality of delayed clock signals DC1-DC5) from the first DLL delay chain 318. Further, the first DLL control circuit 320 may be configured to generate the first control voltage VC1 based on a delay between the reference clock signal RCLK and the fifth delayed clock signal DC5. Although not shown, the first DLL control circuit 320 includes a loop filter, a phase detector that may be configured to determine a phase difference between the reference clock signal RCLK and the fifth delayed clock signal DC5, and a charge pump that may be configured to generate charging and discharging signals to charge and discharge the loop filter, respectively, based on the phase difference between the reference clock signal RCLK and the fifth delayed clock signal DC5. The voltage level associated with the loop filter corresponds to the first control voltage VC1. The first DLL control circuit 320 may be further configured to provide the first control voltage VC1 to the first DLL delay chain 318 (e.g., the control terminals of the first through fifth delay elements 322a-322e) to control the delays of the first through fifth delay elements 322a-322e.

The first control voltage VC1 may be iteratively adjusted to adjust the delay introduced by each delay element. Based on the first DLL 302 operating in a locked state, the delay between the reference clock signal RCLK and the fifth delayed clock signal DC5 may be equal to the time period of the reference clock signal RCLK. Further, as the delay introduced by each delay element is identical, each delay element introduces a delay of 0.2T, where 'T' corresponds to the time period of the reference clock signal RCLK. Thus, each pair of adjacent delayed clock signals have a delay that is equal to 0.2T.

Selection of the First Selected Clock Signal SLCK1:

The first clock selector 304 may be coupled to the first DLL 302 (e.g., the first DLL delay chain 318) and the control circuitry 206 (e.g., the second synchronizer 218). The first clock selector 304 may be configured to receive the fractional data FD from the second synchronizer 218 and the first through fifth delayed clock signals DC1-DC5 from the first DLL delay chain 318. Based on the fractional data FD, the first clock selector 304 may be further configured to select one of the first through fifth delayed clock signals DC1-DC5 as a first DLL clock signal DLLC1. In an embodiment, the first clock selector 304 may correspond to a multiplexer circuit with the fractional data FD acting as a select input thereof. In such a scenario, all the bits of the fractional data FD or a few bits of the fractional data FD may be utilized to enable the selection of one of the first through fifth delayed clock signals DC1-DC5 as the first DLL clock signal DLLC1.

The first output delay chain 306 may be coupled to the first clock selector 304 and the second DLL 316. The first output delay chain 306 may be configured to receive the first DLL clock signal DLLC1 from the first clock selector 304 and a second control voltage VC2 from the second DLL 316. Based on the second control voltage VC2, the first output delay chain 306 may be further configured to generate the second plurality of delayed clock signals that are time-delayed versions of the first DLL clock signal DLLC1. As illustrated in FIG. 3, the second plurality of delayed clock signals include four delayed clock signals, namely, sixth through ninth delayed clock signals DC6-DC9. The second plurality of delayed clock signals are hereinafter referred to and designated as the "second plurality of delayed clock signals DC6-DC9".

The first output delay chain 306 may include a second plurality of series-coupled delay elements that may be coupled to the first clock selector 304 and the second DLL 316. Each delay element of the second plurality of series-coupled delay elements may be configured to receive the second control voltage VC2 that controls the delay introduced by the corresponding delay element. The second plurality of series-coupled delay elements may be configured to generate the second plurality of delayed clock signals DC6-DC9 such that a delay introduced by each delay element of the second plurality of series-coupled delay elements is identical. Further, the second control voltage VC2 may be such that a delay between the first DLL clock signal DLLC1 and a last delayed clock signal of the second plurality of delayed clock signals DC6-DC9 (e.g., the ninth delayed clock signal DC9) may be equal to the time period of the reference clock signal RCLK. The second plurality of series-coupled delay elements may include four delay elements (e.g., sixth through ninth delay elements) which are not labeled in FIG. 3 so as to not obscure the illustration. Further, as the delay introduced by each delay element is identical, each delay element introduces a delay of 0.25T. Thus, each pair of adjacent delayed clock signals have a delay that is equal to 0.25T.

The second clock selector 308 may be coupled to the first output delay chain 306 and the control circuitry 206 (e.g., the second synchronizer 218). The second clock selector 308 may be configured to receive the fractional data FD from the second synchronizer 218 and the sixth through ninth delayed clock signals DC6-DC9 from the first output delay chain 306. Based on the fractional data FD, the second clock selector 308 may be further configured to select one of the sixth through ninth delayed clock signals DC6-DC9 as the first selected clock signal SLCK1. In an embodiment, the second clock selector 308 may correspond to a multiplexer circuit with the fractional data FD acting as a select input thereof. In such a scenario, all the bits of the fractional data FD or a few bits (e.g., FD[0] and FD[1]) of the fractional data FD may be utilized to enable the selection of one of the sixth through ninth delayed clock signals DC6-DC9 as the first selected clock signal SLCK1.

Thus, the first and second DLLs 302 and 316, the first and second clock selectors 304 and 308, and the first output delay chain 306 enable the generation of the first selected clock signal SLCK1 that is utilized for the fractional division associated with the digital frequency synthesizer 106. Thus, the resolution of the digital frequency synthesizer 106 is equal to an inverse of a product of a number of delayed clock signals of the first plurality of delayed clock signals DC1-DC5 and a number of delayed clock signals of the second plurality of delayed clock signals DC6-DC9. As the first plurality of delayed clock signals DC1-DC5 include five delayed clock signals and the second plurality of delayed clock signals DC6-DC9 include four delayed clock signals, the resolution of the digital frequency synthesizer 106 is equal to 0.05.

Selection of the Second Selected Clock Signal SLCK2:

The clocking circuit 202 also generates the second selected clock signal SLCK2 which is utilized for the duty cycle correction associated with the digital frequency synthesizer 106. The first and second DLLs 302 and 316, the third and fourth clock selectors 310 and 314, and the second output delay chain 312 are included in the clocking circuit 202 to enable the generation of the second selected clock signal SLCK2.

The third clock selector 310 may be coupled to the first DLL 302 (e.g., the first DLL delay chain 318) and the control circuitry 206 (e.g., the fifth synchronizer 230). The third clock selector 310 may be configured to receive the duty cycle correction data DCD from the fifth synchronizer 230 and the first through fifth delayed clock signals DC1-DC5 from the first DLL delay chain 318. Based on the duty cycle correction data DCD, the third clock selector 310 may be further configured to select one of the first through fifth delayed clock signals DC1-DC5 as a second DLL clock signal DLLC2. In an embodiment, the third clock selector 310 may correspond to a multiplexer circuit with the duty cycle correction data DCD acting as a select input thereof. In such a scenario, all the bits of the duty cycle correction data DCD or a few bits of the duty cycle correction data DCD may be utilized to enable the selection of one of the first through fifth delayed clock signals DC1-DC5 as the second DLL clock signal DLLC2.

The second output delay chain 312 may be coupled to the third clock selector 310 and the second DLL 316. The second output delay chain 312 may be configured to receive the second DLL clock signal DLLC2 from the third clock selector 310 and the second control voltage VC2 from the second DLL 316. Based on the second control voltage VC2, the second output delay chain 312 may be further configured to generate the third plurality of delayed clock signals that are time-delayed versions of the second DLL clock signal DLLC2. As illustrated in FIG. 3, the third plurality of delayed clock signals include four delayed clock signals, namely, tenth through thirteenth delayed clock signals DC10-DC13. The third plurality of delayed clock signals are hereinafter referred to and designated as the "third plurality of delayed clock signals DC10-DC13".

The second output delay chain 312 may include a third plurality of series-coupled delay elements that may be coupled to the third clock selector 310 and the second DLL 316. Each delay element of the third plurality of series-coupled delay elements may be configured to receive the second control voltage VC2 that controls the delay introduced by the corresponding delay element. The third plurality of series-coupled delay elements may be configured to generate the third plurality of delayed clock signals DC10-DC13 such that a delay introduced by each delay element is identical. Further, the second control voltage VC2 may be such that a delay between the second DLL clock signal DLLC2 and a last delayed clock signal of the third plurality of delayed clock signals DC10-DC13 (e.g., the thirteenth delayed clock signal DC13) may be equal to the time period of the reference clock signal RCLK. The third plurality of series-coupled delay elements may include four delay elements (e.g., tenth through thirteenth delay elements) which are not labeled in FIG. 3 so as to not obscure the illustration. Further, as the delay introduced by each delay element is identical, each delay element introduces a delay of 0.25T. Thus, each pair of adjacent delayed clock signals have a delay that is equal to 0.25T.

The fourth clock selector 314 may be coupled to the second output delay chain 312 and the control circuitry 206 (e.g., the fifth synchronizer 230). The fourth clock selector 314 may be configured to receive the duty cycle correction data DCD from the fifth synchronizer 230 and the tenth through thirteenth delayed clock signals DC10-DC13 from the second output delay chain 312. Based on the duty cycle correction data DCD, the fourth clock selector 314 may be further configured to select one of the tenth through thirteenth delayed clock signals DC10-DC13 as the second selected clock signal SLCK2. In an embodiment, the fourth clock selector 314 may correspond to a multiplexer circuit with the duty cycle correction data DCD acting as a select input thereof. In such a scenario, all the bits of the duty cycle correction data DCD or a few bits (e.g., DCD[0] and DCD[1]) of the duty cycle correction data DCD may be utilized to enable the selection of one of the tenth through thirteenth delayed clock signals DC10-DC13 as the second selected clock signal SLCK2.

The second plurality of delayed clock signals DC6-DC9 and the third plurality of delayed clock signals DC10-DC13 are maintained at a delay of 0.25T with respect to an adjacent delayed clock signal by way of the second control voltage VC2. The second DLL 316 is included in the clocking circuit 202 to ensure that the second control voltage VC2 is at a desired value. The second DLL 316 may be coupled to the clock generator 102. The second DLL 316 may be configured to receive the reference clock signal RCLK from the clock generator 102 and generate a fourth plurality of delayed clock signals and the second control voltage VC2. As illustrated in FIG. 3, the fourth plurality of delayed clock signals include four delayed clock signals, namely, fourteenth through seventeenth delayed clock signals DC14-DC17. The fourth plurality of delayed clock signals (hereinafter referred to and designated as the "fourth plurality of delayed clock signals DC14-DC17") are the time-delayed versions of the reference clock signal RCLK. The second DLL 316 may include a second DLL delay chain 324 and a second DLL control circuit 326.

The second DLL delay chain 324 may be coupled to the clock generator 102 and the second DLL control circuit 326. The second DLL delay chain 324 may be configured to receive the reference clock signal RCLK from the clock generator 102 and the second control voltage VC2 from the second DLL control circuit 326. Based on the reference clock signal RCLK and the second control voltage VC2, the second DLL delay chain 324 may be further configured to generate the fourth plurality of delayed clock signals DC14-DC17. The second DLL delay chain 324 may include a fourth plurality of series-coupled delay elements that are configured to generate the fourth plurality of delayed clock signals DC14-DC17 such that a delay introduced by each delay element is identical. The fourth plurality of series-coupled delay elements may include four delay elements (e.g., fourteenth through seventeenth delay elements) which are not labeled in FIG. 3 so as to not obscure the illustration. The resolution of the digital frequency synthesizer 106 is equal to an inverse of a product of the number of delayed clock signals of the first plurality of delayed clock signals DC1-DC5 and the number of delayed clock signals of the fourth plurality of delayed clock signals DC14-DC17. In other words, the resolution of the digital frequency synthesizer 106 is equal to an inverse of a product of the number of delay elements of the first DLL 302 and the number of delay elements of the second DLL 316. Thus, if the number of delay elements of the first DLL 302 is denoted by 'N', the resolution of the digital frequency synthesizer 106 is equal to $1/(N*(N-1))$.

The second DLL control circuit 326 may be coupled to the clock generator 102, the second DLL delay chain 324, and the first and second output delay chains 306 and 312. The second DLL control circuit 326 may be configured to receive the reference clock signal RCLK from the clock generator 102 and the seventeenth delayed clock signal DC17 (e.g., a last delayed clock signal of the fourth plurality of delayed clock signals DC14-DC17) from the second DLL delay chain 324. Further, the second DLL control circuit 326 may be configured to generate the second control voltage VC2 based on a delay between the reference clock signal RCLK and the seventeenth delayed clock signal DC17. The second DLL control circuit 326 may be structurally and functionally similar to the first DLL control circuit 320. The second DLL control circuit 326 may be further configured to provide the second control voltage VC2 to the first and second output delay chains 306 and 312 (e.g., the control terminals of the sixth through thirteenth delay elements) to control the delays of the sixth through thirteenth delay elements.

The second control voltage VC2 may be iteratively adjusted to adjust the delay introduced by each delay element. Based on the second DLL 316 operating in a locked state, the delay between the reference clock signal RCLK and the seventeenth delayed clock signal DC17 may be equal to the time period of the reference clock signal RCLK. Further, as the second control voltage VC2 controls the delays of the sixth through thirteenth delay elements, based on the second DLL 316 operating in a locked state, the delay between the first DLL clock signal DLLC1 and the ninth delayed clock signal DC9 and the delay between the second DLL clock signal DLLC2 and the thirteenth delayed clock signal DC13 may be equal to the time period of the reference clock signal RCLK.

The digital frequency synthesizer 106 thus utilizes the clocking circuit 202 (i.e., a combination of two DLLs (e.g., the first and second DLLs 302 and 316), two output delay chains (e.g., the first and second output delay chains 306 and 312), and four clock selectors (e.g., the first through fourth clock selectors 304, 308, 310, and 314)) to generate the first and second selected clock signals SLCK1 and SLCK2. The first and second selected clock signals SLCK1 and SLCK2 are utilized for adjusting the rising and falling edges of the integer-divided clock signal IDCK to enable the fractional division and the duty cycle correction in the digital frequency synthesizer 106, respectively. The utilization of two DLLs, two output delay chains, and four clock selectors for generating two clock signals that enable the fractional division and the duty cycle correction distinguishes the digital frequency synthesizer 106 from the conventional digital frequency synthesizer which utilizes a VCO (e.g., a ring oscillator) to generate various VCO clock signals and two multiplexers to select, based on fractional and duty cycle correction data, two different VCO clock signals for adjusting the rising and falling edges of an integer-divided clock signal.

The utilization of DLLs and output delay chains over a VCO has numerous advantages. In the present disclosure, as the resolution of the digital frequency synthesizer 106 is equal to an inverse of a product of a number of delay elements of the first and second DLLs 302 and 316, a resolution of 0.05 may be achieved by utilizing exclusively nine clock signals (e.g., five original phases). In contrast, the conventional digital frequency synthesizer would require 20 clock signals to achieve a resolution of 0.05, as the resolution of the conventional digital frequency synthesizer is equal to an inverse of a number of VCO clock signals. As a result, the complexity of the digital frequency synthesizer 106 is significantly less than that of the conventional digital frequency synthesizer. Further, the digital frequency synthesizer 106 utilizes DLLs and delay chains to generate the clock signals, whereas, the conventional digital frequency synthesizer utilizes a ring oscillator. Thus, the dynamic power consumption of the digital frequency synthesizer 106 is significantly less than that of the conventional digital frequency synthesizer.

The delay elements of the clocking circuit 202 are substantially identical (e.g., have substantially the same size and configuration).

Although it is described that the delay introduced by each delay element is identical, the scope of the present disclosure is not limited to it. In practical applications, the delay may vary within a tolerance limit, without deviating from the scope of the present disclosure.

Figure 4A:
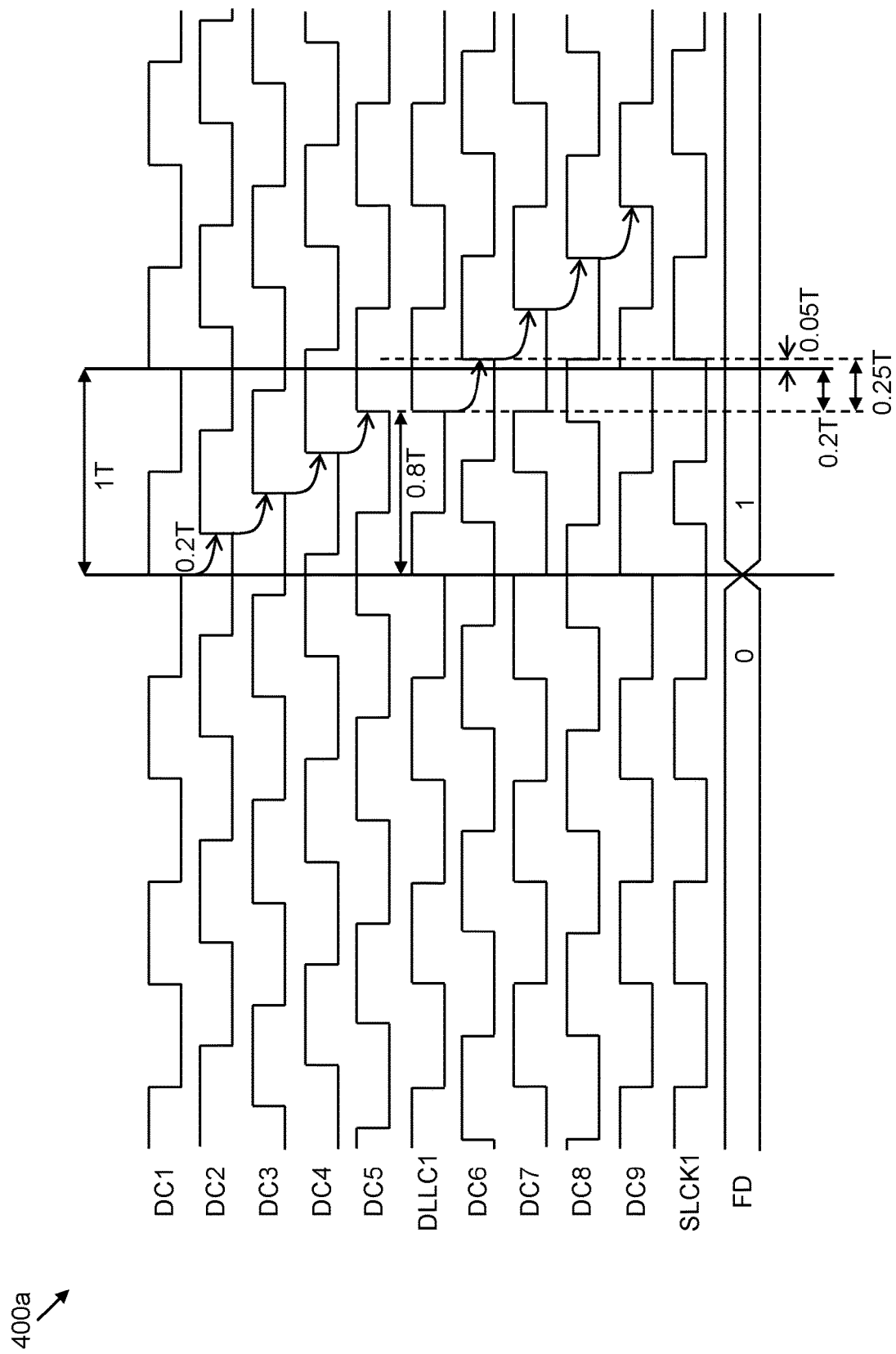
FIG. 4A is a first timing diagram that illustrates generation of a first selected clock signal in accordance with an embodiment of the present disclosure.

The generation of the first selected clock signal SLCK1 for different values of the fractional data FD is illustrated in FIGS. 4A and 4B. The second selected clock signal SLCK2 may be generated in a similar manner for different values of the duty cycle correction data DCD.

FIG. 4A is a first timing diagram 400a that illustrates the generation of the first selected clock signal SLCK1 in accordance with an embodiment of the present disclosure. As illustrated in FIG. 3, the first DLL delay chain 318 includes five delay elements and the first output delay chain 306 includes four delay elements. The nine delayed clock signals (e.g., the first through ninth delayed clock signals DC1-DC9) generated by these nine delay elements (e.g., the first through fifth delay elements 322a-322e and the sixth through ninth delay elements) enable the fractional division associated with the digital frequency synthesizer 106.

As illustrated in the first timing diagram 400a, the second delayed clock signal DC2 lags the first delayed clock signal DC1 by 0.2T. Similarly, the third delayed clock signal DC3 lags the second delayed clock signal DC2, the fourth delayed clock signal DC4 lags the third delayed clock signal DC3, and the fifth delayed clock signal DC5 lags the fourth delayed clock signal DC4 by 0.2T. Further, the seventh delayed clock signal DC7 lags the sixth delayed clock signal DC6 by 0.25T. Similarly, the eighth delayed clock signal DC8 lags the seventh delayed clock signal DC7, and the ninth delayed clock signal DC9 lags the eighth delayed clock signal DC8 by 0.25T. 'T' corresponds to the time period of the reference clock signal RCLK.

Based on the fractional data FD, one of the first through fifth delayed clock signals DC1-DC5 is selected as the first DLL clock signal DLLC1. The sixth through ninth delayed clock signals DC6-DC9 are then adjusted based on the first DLL clock signal DLLC1, and one of the sixth through ninth delayed clock signals DC6-DC9 is selected as the first selected clock signal SLCK1 based on the fractional data FD.

The first timing diagram 400a is described for the fractional factor FRF of 1. When the fractional factor FRF is 1, the product of the fractional factor FRF and the resolution of the digital frequency synthesizer 106 is equal to 0.05. Further, when the fractional factor FRF is 1, the fractional data FD is incremented in steps of 1.

When the fractional data FD has the value 0, the first delayed clock signal DC1 is selected as the first DLL clock signal DLLC1. Thus, the sixth through ninth delayed clock signals DC6-DC9 lag the first delayed clock signal DC1 by 0.25T. 0.5T, 0.75T, and 1T, respectively. In other words, the first and ninth delayed clock signals DC1 and DC9 are synchronous. The ninth delayed clock signal DC9 is selected as the first selected clock signal SLCK1.

As the fractional factor FRF is 1, the time period of the first selected clock signal SLCK1 is required to be 1.05T and has to remain constant for each increment of the fractional data FD. When the fractional data FD transitions from 0 to 1, the fifth delayed clock signal DC5 is selected as the first DLL clock signal DLLC1. The first DLL clock signal DLLC1 thus lags the first delayed clock signal DC1 by 0.8T. Consequently, the sixth through ninth delayed clock signals DC6-DC9 may lag the first delayed clock signal DC1 by 1.05T, 1.3T, 1.55T, and 1.8T, respectively. As a result, the sixth delayed clock signal DC6 is selected as the first selected clock signal SLCK1, thereby ensuring that the time period of the first selected clock signal SLCK1 is 1.05T.

It is not sufficient to shift the time period only once. For example, if the sixth delayed clock signal DC6 is continuously selected as the first selected clock signal SLCK1, the time period of the first selected clock signal SLCK1 may revert to be equal to that of the reference clock signal RCLK, thereby failing to achieve the fractional division. Hence, with each increment of the fractional data FD, a different combination of the first DLL clock signal DLLC1 and the first selected clock signal SLCK1 is selected so as to ensure that for each cycle of the first selected clock signal SLCK1, the time period is equal to 1.05T. Thus, when the fractional data FD transitions from 1 to 2, the fourth delayed clock signal DC4 is selected as the first DLL clock signal DLLC1, resulting in a delay of 0.6T. Further, the seventh delayed clock signal DC7 is selected as the first selected clock signal SLCK1 to achieve a total delay of 1.1T (e.g., 0.6T+0.5T). The delay of 1.1T is with respect to the first delayed clock signal DC1. However, with respect to the previous clock cycle (e.g., when the fractional data FD was at the value 1), the time period of the first selected clock signal SLCK1 is equal to 1.05T.

A table illustrating the different combinations for different values of the fractional data FD is illustrated in FIG. 4B. With each increment of 1, 0.05T is added to the first selected clock signal SLCK1 to ensure that the time period is maintained at 1.05T. After 20 increments (e.g., the fractional data FD values of 0 to 19), 1T of additional delay is added to the first selected clock signal SLCK1. At such an instance, the carry bit CY is asserted and the integer-divided clock signal IDCK consumes one extra cycle of the first delayed clock signal DC1 to compensate for the added delay. The increments may continue further thereby ensuring accurate fractional division.

FIG. 4B is a table 400b that illustrates the generation of the first selected clock signal SLCK1 for each increment of the fractional data FD in accordance with an embodiment of the present disclosure. The table 400b includes first through fourth columns 402a-402d. The first column 402a corresponds to the value of the fractional data FD and the second column 402b corresponds to the fraction indicated by each value of the fractional data FD. Further, the third column 402c corresponds to one of the first through fifth delayed clock signals DC1-DC5 selected as the first DLL clock signal DLLC1 for each value of the fractional data FD. Similarly, the fourth column 402d corresponds to one of the sixth through ninth delayed clock signals DC6-DC9 selected as the first selected clock signal SLCK1 for each value of the fractional data FD.

As illustrated by a first row of the table 400b, the fractional data FD having the value '0' corresponds to a fraction of '0', and in such a scenario, the first and ninth delayed clock signals DC1 and DC9 are selected as the first DLL clock signal DLLC1 and the first selected clock signal SLCK1, respectively. Further, as illustrated by a second row of the table 400b, the fractional data FD having the value '1' corresponds to a fraction of '0.05', and in such a scenario, the fifth and sixth delayed clock signals DC5 and DC6 are selected as the first DLL clock signal DLLC1 and the first selected clock signal SLCK1, respectively. Similarly, as illustrated by a third row of the table 400b, the fractional data FD having the value '2' corresponds to a fraction of '0.1', and in such a scenario, the fourth and seventh delayed clock signals DC4 and DC7 are selected as the first DLL clock signal DLLC1 and the first selected clock signal SLCK1, respectively.

As illustrated by a fourth row of the table 400b, the fractional data FD having the value '3' corresponds to a fraction of '0.15', and in such a scenario, the third and eighth delayed clock signals DC3 and DC8 are selected as the first DLL clock signal DLLC1 and the first selected clock signal SLCK1, respectively. Further, as illustrated by a fifth row of the table 400b, the fractional data FD having the value '4' corresponds to a fraction of '0.2', and in such a scenario, the second and ninth delayed clock signals DC2 and DC9 are selected as the first DLL clock signal DLLC1 and the first selected clock signal SLCK1, respectively. Similarly, as illustrated by a sixth row of the table 400b, the fractional data FD having the value '5' corresponds to a fraction of '0.25', and in such a scenario, the first and sixth delayed clock signals DC1 and DC6 are selected as the first DLL clock signal DLLC1 and the first selected clock signal SLCK1, respectively.

Thus, for each increment of the fractional data FD, a different pair of delayed clock signals is selected as the first DLL clock signal DLLC1 and the first selected clock signal SLCK1.

The table 400b illustrates the selections for each value of the fractional data FD. However, the increment of the fractional data FD for each cycle is controlled based on the value of the fractional factor FRF. The increment of 1 is applicable when the fractional factor FRF is equal to 1. However, if the fractional factor FRF is equal to 5, the fractional data FD may be updated in the following pattern: 0, 5, 10, 15, 0, 5, 10, 15, and so on. In such a scenario, for each cycle, the corresponding pair of the delayed clock signals is selected as the first DLL clock signal DLLC1 and the first selected clock signal SLCK1.

Figure 5:
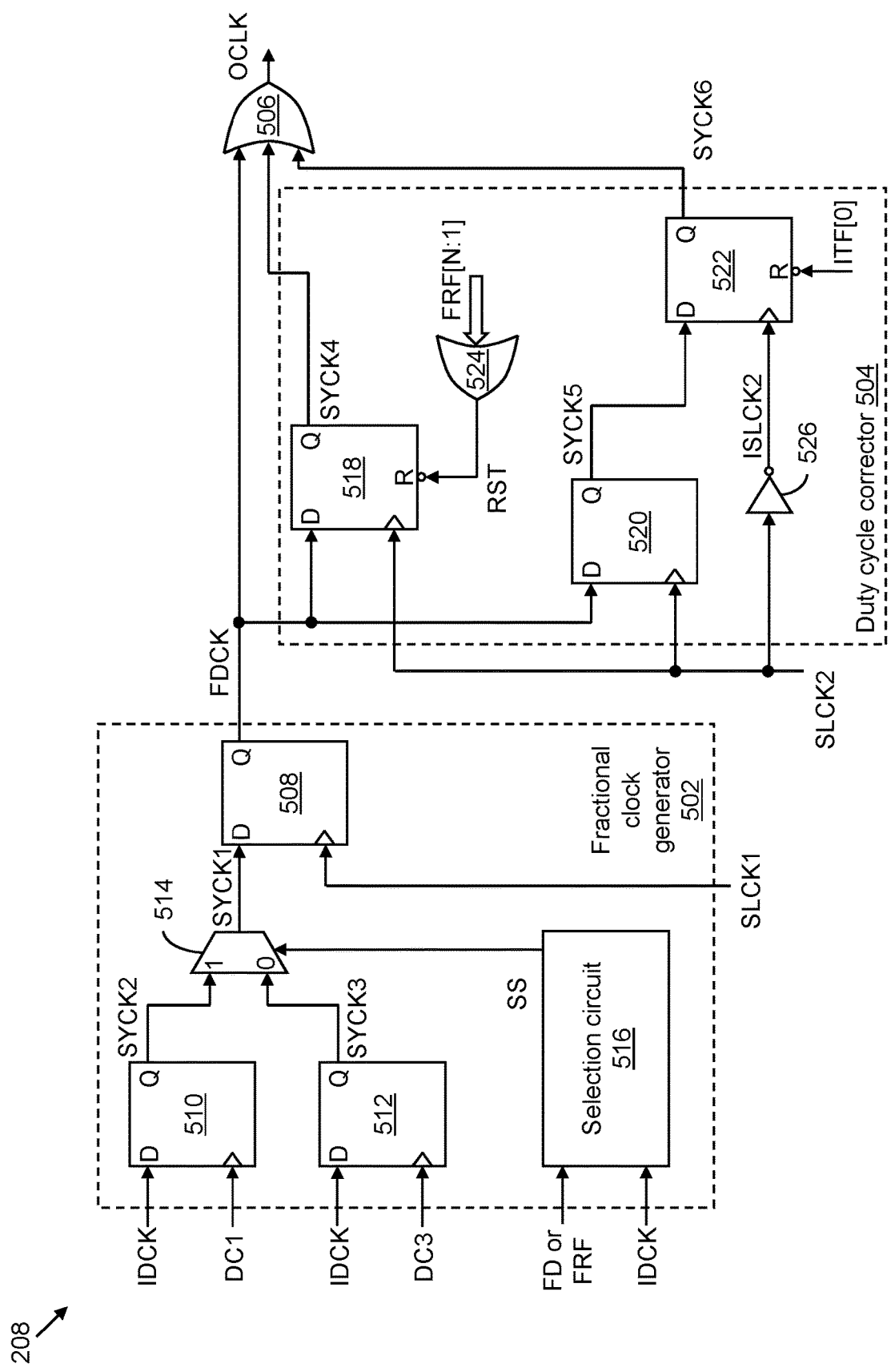
FIG. 5 illustrates a schematic block diagram of an output circuit of the digital frequency synthesizer of FIG. 2 in accordance with an embodiment of the present disclosure.

FIG. 5 illustrates a schematic block diagram of the output circuit 208 in accordance with an embodiment of the present disclosure. The output circuit 208 may include a fractional clock generator 502, a duty cycle corrector 504, and a first logic gate 506.

The fractional clock generator 502 may be coupled to the clock divider 204, the clocking circuit 202 (e.g., the first DLL delay chain 318 and the second clock selector 308), and the control circuitry 206 (e.g., the second synchronizer 218). The fractional clock generator 502 may be configured to receive the integer-divided clock signal IDCK from the clock divider 204, the first selected clock signal SLCK1 from the second clock selector 308, the fractional data FD from the second synchronizer 218, and the first and third delayed clock signals DC1 and DC3 from the first DLL delay chain 318. In such a scenario, the third delayed clock signal DC3 corresponds to the intermediate delayed clock signal IMCK. The fractional clock generator 502 may be further configured to adjust, to enable the fractional division, the integer-divided clock signal IDCK based on the first selected clock signal SLCK1, the fractional data FD, and the first and third delayed clock signals DC1 and DC3, and generate the fractional-divided clock signal (hereinafter referred to and designated as the "fractional-divided clock signal FDCK"). In an embodiment, the rising edge of the integer-divided clock signal IDCK is adjusted to generate the fractional-divided clock signal FDCK. The fractional-divided clock signal FDCK is a fractional-divided version of the reference clock signal RCLK. A frequency of the fractional-divided clock signal FDCK is equal to the frequency of the reference clock signal divided by the fractional value.

The fractional clock generator 502 may include a sixth synchronizer 508 that may be coupled to the second clock selector 308. The sixth synchronizer 508 may be configured to receive the first selected clock signal SLCK1 from the second clock selector 308. Further, the sixth synchronizer 508 may be configured to receive a first synchronized clock signal SYCK1 that is derived from the integer-divided clock signal IDCK. The sixth synchronizer 508 may be further configured to sample the first synchronized clock signal SYCK1 based on the first selected clock signal SLCK1 to generate the fractional-divided clock signal FDCK. The sampling of the first synchronized clock signal SYCK1 based on the first selected clock signal SLCK1 results in a rising edge of the first synchronized clock signal SYCK1 being adjusted. The rising edge of the first synchronized clock signal SYCK1 is adjusted such that the frequency of the fractional-divided clock signal FDCK is equal to the frequency of the reference clock signal RCLK divided by the fractional value. In an embodiment, the sixth synchronizer 508 corresponds to a D-flip-flop.

To enable the derivation of the first synchronized clock signal SYCK1 from the integer-divided clock signal IDCK, the fractional clock generator 502 may further include seventh and eighth synchronizers 510 and 512, a multiplexer 514, and a selection circuit 516.

The seventh synchronizer 510 may be coupled to the clock divider 204 and the first DLL delay chain 318. The seventh synchronizer 510 may be configured to receive the integer-divided clock signal IDCK from the clock divider 204 and the first delayed clock signal DC1 from the first DLL delay chain 318. Further, the seventh synchronizer 510 may be configured to sample the integer-divided clock signal IDCK based on the first delayed clock signal DC1 to generate a second synchronized clock signal SYCK2. Similarly, the eighth synchronizer 512 may be coupled to the clock divider 204 and the first DLL delay chain 318. The eighth synchronizer 512 may be configured to receive the integer-divided clock signal IDCK from the clock divider 204 and the third delayed clock signal DC3 from the first DLL delay chain 318. Further, the eighth synchronizer 512 may be configured to sample the integer-divided clock signal IDCK based on the third delayed clock signal DC3 to generate a third synchronized clock signal SYCK3. The integer-divided clock signal IDCK is pre-synchronized with two different delayed clock signals to meet set-up-and-hold timings at the sixth synchronizer 508. In an embodiment, each of the seventh and eighth synchronizers 510 and 512 corresponds to a D-flip-flop.

Although it is described that the third delayed clock signal DC3 corresponds to the intermediate delayed clock signal IMCK, the scope of the present disclosure is not limited to it. In various other embodiments, any other delayed clock signal of the first plurality of delayed clock signals DC1-DC5 that is different from the first delayed clock signal DC1 may be utilized, without deviating from the scope of the present disclosure.

The multiplexer 514 may be coupled to the seventh and eighth synchronizers 510 and 512 and the selection circuit 516. The multiplexer 514 may be configured to receive the second and third synchronized clock signals SYCK2 and SYCK3 from the seventh and eighth synchronizers 510 and 512, respectively. Further, the multiplexer 514 may be configured to receive a select signal SS from the selection circuit 516. The select signal SS may be asserted based on the product of the fractional factor FRF and the resolution of the digital frequency synthesizer 106 being greater than a first predefined value. Conversely, the select signal SS may be de-asserted based on the product of the fractional factor FRF and the resolution of the digital frequency synthesizer 106 being less than or equal to the first predefined value. The product of the fractional factor FRF and the resolution of the digital frequency synthesizer 106 is a decimal value that ranges between zero and one. In an embodiment, the first predefined value corresponds to 0.5. However, the first predefined value may be different in other embodiments.

Based on the select signal SS and the second and third synchronized clock signals SYCK2 and SYCK3, the multiplexer 514 may be further configured to generate the first synchronized clock signal SYCK1. In an embodiment, based on the assertion of the select signal SS, the first synchronized clock signal SYCK1 is the same as the second synchronized clock signal SYCK2. Conversely, based on the de-assertion of the select signal, the first synchronized clock signal SYCK1 is the same as the third synchronized clock signal SYCK3.

The selection circuit 516 may be coupled to the control circuitry 206 (e.g., the second synchronizer 218), the clock divider 204, and the processing circuit 104. The selection circuit 516 includes suitable circuitry configured to perform one or more operations. For example, the selection circuit 516 may be configured to receive at least one of the fractional data FD and the fractional factor FRF from the second synchronizer 218 and the processing circuit 104, respectively. Further, the selection circuit 516 may be configured to receive the integer-divided clock signal IDCK from the clock divider 204. The selection circuit 516 may be further configured to determine whether the product of the fractional factor FRF and the resolution of the digital frequency synthesizer 106 is greater than the first predefined value based on the integer-divided clock signal IDCK and at least one of the fractional data FD and the fractional factor FRF. Further, the selection circuit 516 may be configured to generate the select signal SS in the asserted or de-asserted state. In an embodiment, the selection circuit 516 corresponds to a synchronizer that samples one data bit of the fractional data FD or the fractional factor FRF (e.g., the fourth data bits FD[3] or FRF[3]) based on the integer-divided clock signal IDCK to generate the select signal SS. However, in other embodiments, the selection circuit 516 may be implemented using different configurations, without deviating from the scope of the present disclosure.

The duty cycle corrector 504 may be coupled to the fractional clock generator 502, the clocking circuit 202 (e.g., the fourth clock selector 314), and the processing circuit 104. The duty cycle corrector 504 may be configured to receive the fractional-divided clock signal FDCK from the fractional clock generator 502, the second selected clock signal SLCK2 from the fourth clock selector 314, and the integer and fractional factors ITF and FRF from the processing circuit 104. Based on the fractional-divided clock signal FDCK, the second selected clock signal SLCK2, and the integer and fractional factors ITF and FRF, the duty cycle corrector 504 may be further configured to generate a set of correction signals. The set of correction signals may enable the correction of the duty cycle of the fractional-divided clock signal FDCK. The duty cycle corrector 504 may include ninth through eleventh synchronizers 518-522, a second logic gate 524, and a second inverter 526.

The ninth synchronizer 518 may be coupled to the fractional clock generator 502 and the clocking circuit 202 (e.g., the fourth clock selector 314). The ninth synchronizer 518 may be configured to receive the fractional-divided clock signal FDCK from the fractional clock generator 502 and the second selected clock signal SLCK2 from the fourth clock selector 314, and sample the fractional-divided clock signal FDCK based on the second selected clock signal SLCK2 to generate a fourth synchronized clock signal SYCK4. In an embodiment, the ninth synchronizer 518 corresponds to a D-flip-flop. The ninth synchronizer 518 may be activated based on the fractional factor FRF being greater than a second predefined value and deactivated based on the fractional factor FRF being less than or equal to the second predefined value. In an embodiment, the second predefined value is equal to one. The ninth synchronizer 518 thus samples the fractional-divided clock signal FDCK further based on the fractional factor FRF. The second logic gate 524 is included in the duty cycle corrector 504 to control the activation and deactivation of the ninth synchronizer 518.

The second logic gate 524 may be coupled to the processing circuit 104 and the ninth synchronizer 518 (e.g., a reset terminal of the ninth synchronizer 518). The second logic gate 524 may be configured to receive the fractional factor FRF (e.g., all data bits except the least significant bit) from the processing circuit 104 and generate a reset signal RST. In an embodiment, the second logic gate 524 corresponds to an OR gate. Thus, the reset signal RST is de-asserted when all the received data bits are de-asserted. Further, the reset terminal of the ninth synchronizer 518 is an active-low terminal. As a result, the de-asserted reset signal RST renders the ninth synchronizer 518 deactivated. In other words, the ninth synchronizer 518 is deactivated when the fractional factor FRF is equal to or less than one. Conversely, the reset signal RST is asserted when at least one of the received data bits is asserted. Thus, the ninth synchronizer 518 is activated when the fractional factor FRF is greater than one. The ninth synchronizer 518 thus enables the duty cycle correction exclusively when the fractional factor FRF is greater than one.

The tenth synchronizer 520 may be coupled to the fractional clock generator 502 and the clocking circuit 202 (e.g., the fourth clock selector 314). The tenth synchronizer 520 may be configured to receive the fractional-divided clock signal FDCK from the fractional clock generator 502 and the second selected clock signal SLCK2 from the fourth clock selector 314, and sample the fractional-divided clock signal FDCK based on the second selected clock signal SLCK2 to generate a fifth synchronized clock signal SYCK5. In an embodiment, the tenth synchronizer 520 corresponds to a D-flip-flop.

The second inverter 526 may be coupled to the clocking circuit 202 (e.g., the fourth clock selector 314). The second inverter 526 may be configured to receive the second selected clock signal SLCK2 from the fourth clock selector 314 and generate an inverted second selected clock signal ISLCK2.

The eleventh synchronizer 522 may be coupled to the tenth synchronizer 520 and the second inverter 526. The eleventh synchronizer 522 may be configured to receive the fifth synchronized clock signal SYCK5 from the tenth synchronizer 520 and the inverted second selected clock signal ISLCK2 from the second inverter 526. Further, the eleventh synchronizer 522 may be configured to sample the fifth synchronized clock signal SYCK5 based on the inverted second selected clock signal ISLCK2 to generate a sixth synchronized clock signal SYCK6. In an embodiment, the eleventh synchronizer 522 corresponds to a D-flip-flop. The eleventh synchronizer 522 may be activated based on the integer factor ITF being an odd value and deactivated based on the integer factor ITF being an even value. The eleventh synchronizer 522 thus samples the fifth synchronized clock signal SYCK5 further based on the integer factor ITF. In an embodiment, the eleventh synchronizer 522 (e.g., a reset terminal of the eleventh synchronizer 522) may be coupled to the processing circuit 104, and configured to receive the least significant bit ITF[0] of the integer factor ITF from the processing circuit 104. The reset terminal of the eleventh synchronizer 522 is an active-low terminal. As a result, the de-asserted least significant bit ITF[0] of the integer factor ITF renders the ninth synchronizer 518 deactivated, whereas, the asserted least significant bit ITF[0] of the integer factor ITF renders the ninth synchronizer 518 activated.

The output clock signal OCLK may be generated based on the fractional-divided clock signal FDCK and the set of correction signals. The set of correction signals includes the fourth synchronized clock signal SYCK4 and the sixth synchronized clock signal SYCK6. Further, the output clock signal OCLK may correspond to the fractional-divided clock signal FDCK with the duty cycle thereof adjusted based on the second selected clock signal SLCK2.

The first logic gate 506 may be coupled to the fractional clock generator 502 (e.g., the sixth synchronizer 508) and the duty cycle corrector 504 (e.g., the ninth and eleventh synchronizers 518 and 522). The first logic gate 506 may be configured to receive the fractional-divided clock signal FDCK from the sixth synchronizer 508, the fourth synchronized clock signal SYCK4 from the ninth synchronizer 518, and the sixth synchronized clock signal SYCK6 from the eleventh synchronizer 522. Based on the fractional-divided clock signal FDCK, the fourth synchronized clock signal SYCK4, and the sixth synchronized clock signal SYCK6, the first logic gate 506 may be further configured to generate the output clock signal OCLK. In an embodiment, the first logic gate 506 is an OR gate. Thus, the output clock signal OCLK is asserted based on the assertion of at least one of the fractional-divided clock signal FDCK, the fourth synchronized clock signal SYCK4, and the sixth synchronized clock signal SYCK6. Conversely, the output clock signal OCLK is de-asserted based on the de-assertion of the fractional-divided clock signal FDCK, the fourth synchronized clock signal SYCK4, and the sixth synchronized clock signal SYCK6.

Thus, the rising edge of the integer-divided clock signal IDCK is adjusted based on the first selected clock signal SLCK1 to enable the fractional division and generate the fractional-divided clock signal FDCK that is the fractional-divided version of the reference clock signal RCLK. As exclusively the rising edge is adjusted, the duty cycle of the fractional-divided clock signal FDCK may not be close to 50%. In such a scenario, the duty cycle corrector 504 generates the fourth and sixth synchronized clock signals SYCK4 and SYCK6 to adjust the falling edge, and in turn, the duty cycle, of the fractional-divided clock signal FDCK. The duty cycle correction may not be implemented in all scenarios. For example, the duty cycle correction is implemented exclusively when the integer factor ITF is an odd value and/or the fractional factor FRF is greater than one. Different scenarios associated with the digital frequency synthesizer 106 are illustrated in FIGS. 6A-6D.

FIGS. 6A-6D are second through fifth timing diagrams 600a-600d that illustrate the fractional division and the duty cycle correction implemented by the digital frequency synthesizer 106 in accordance with an embodiment of the present disclosure.

Figure 6A:
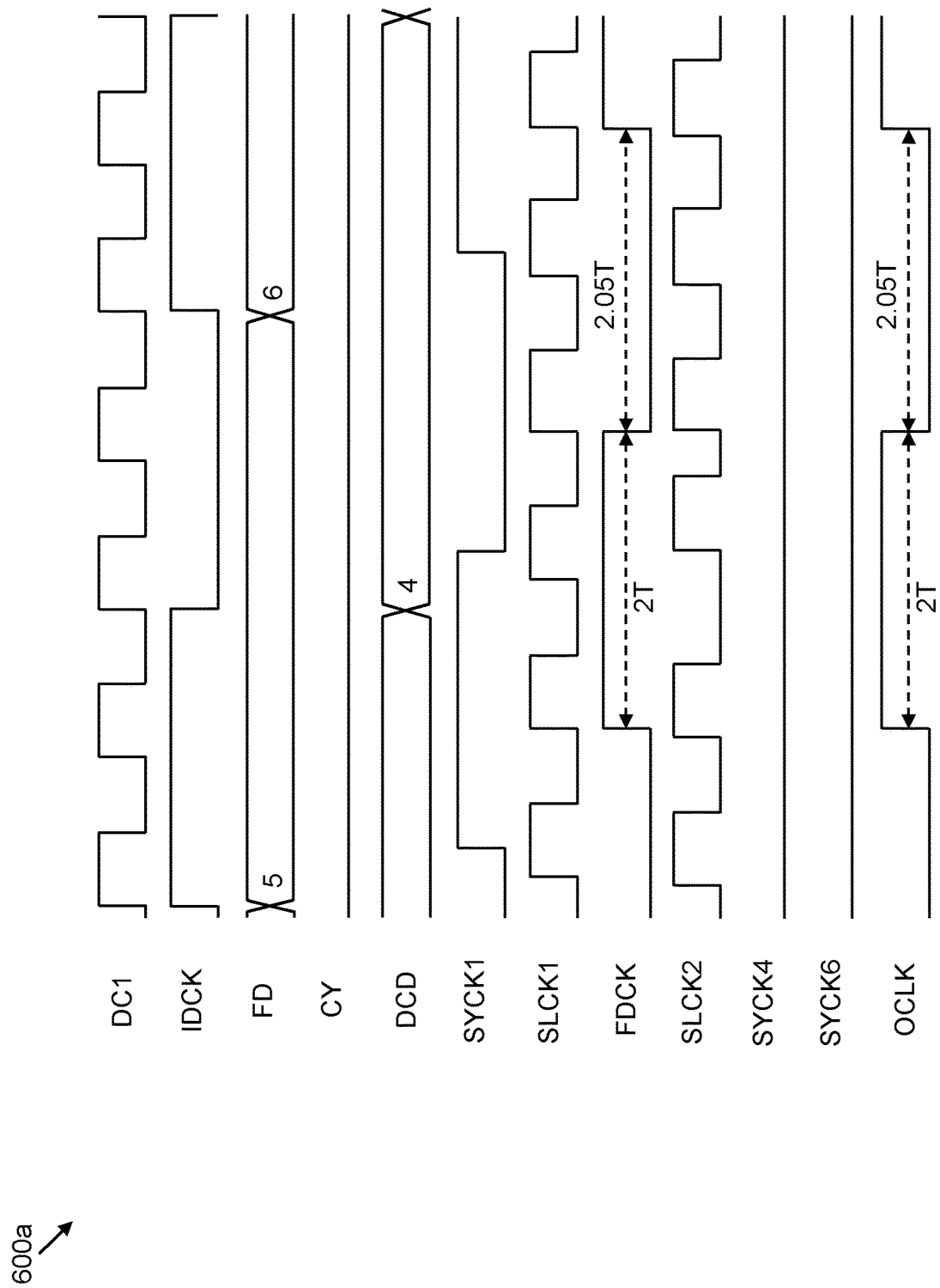
FIGS. 6A-6D are second through fifth timing diagrams that illustrate fractional division and duty cycle correction implemented by the digital frequency synthesizer of FIG. 2 in accordance with an embodiment of the present disclosure.

FRF=1 and ITF=Even Value:

The second timing diagram 600a illustrates a scenario where the integer factor ITF is 4 (e.g., an even value) and the fractional factor FRF is 1. The fractional value associated with the fractional division is thus 4.05. As illustrated in FIG. 6A, the integer-divided clock signal IDCK is a divided version of the first delayed clock signal DC1. The frequency of the first delayed clock signal DC1 is divided by 4 to generate the integer-divided clock signal IDCK. Further, the fractional data FD is incrementing in steps of 1 and in synchronization with the rising edge of the integer-divided clock signal IDCK. Similarly, the duty cycle correction data DCD is synchronous with the falling edge of the integer-divided clock signal IDCK. As the values are below 20, the carry bit CY is de-asserted. The first selected clock signal SLCK1 is controlled based on the fractional data FD and the second selected clock signal SLCK2 is controlled based on the duty cycle correction data DCD. Further, the first synchronized clock signal SYCK1 is a delayed version of the integer-divided clock signal IDCK. The first synchronized clock signal SYCK1 is sampled based on the first selected clock signal SLCK1 to generate the fractional-divided clock signal FDCK.

The fractional-divided clock signal FDCK achieves the time period of 4.05T by having the ON-time duration of 2T and the OFF-time duration of 2.05T, where T corresponds to the time period of the reference clock signal RCLK and the first delayed clock signal DC1. As the fractional factor FRF is 1, the fourth synchronized clock signal SYCK4 remains de-asserted. Similarly, as the integer factor ITF is an even value, the sixth synchronized clock signal SYCK6 remains de-asserted. As a result, the output clock signal OCLK is the same as the fractional-divided clock signal FDCK (e.g., ignoring the propagation delay introduced by the first logic gate 506). Thus, in the scenario illustrated in the second timing diagram 600a, the duty cycle correction is not implemented as the required duty cycle correction is less than the resolution of the digital frequency synthesizer 106.

Figure 6B:
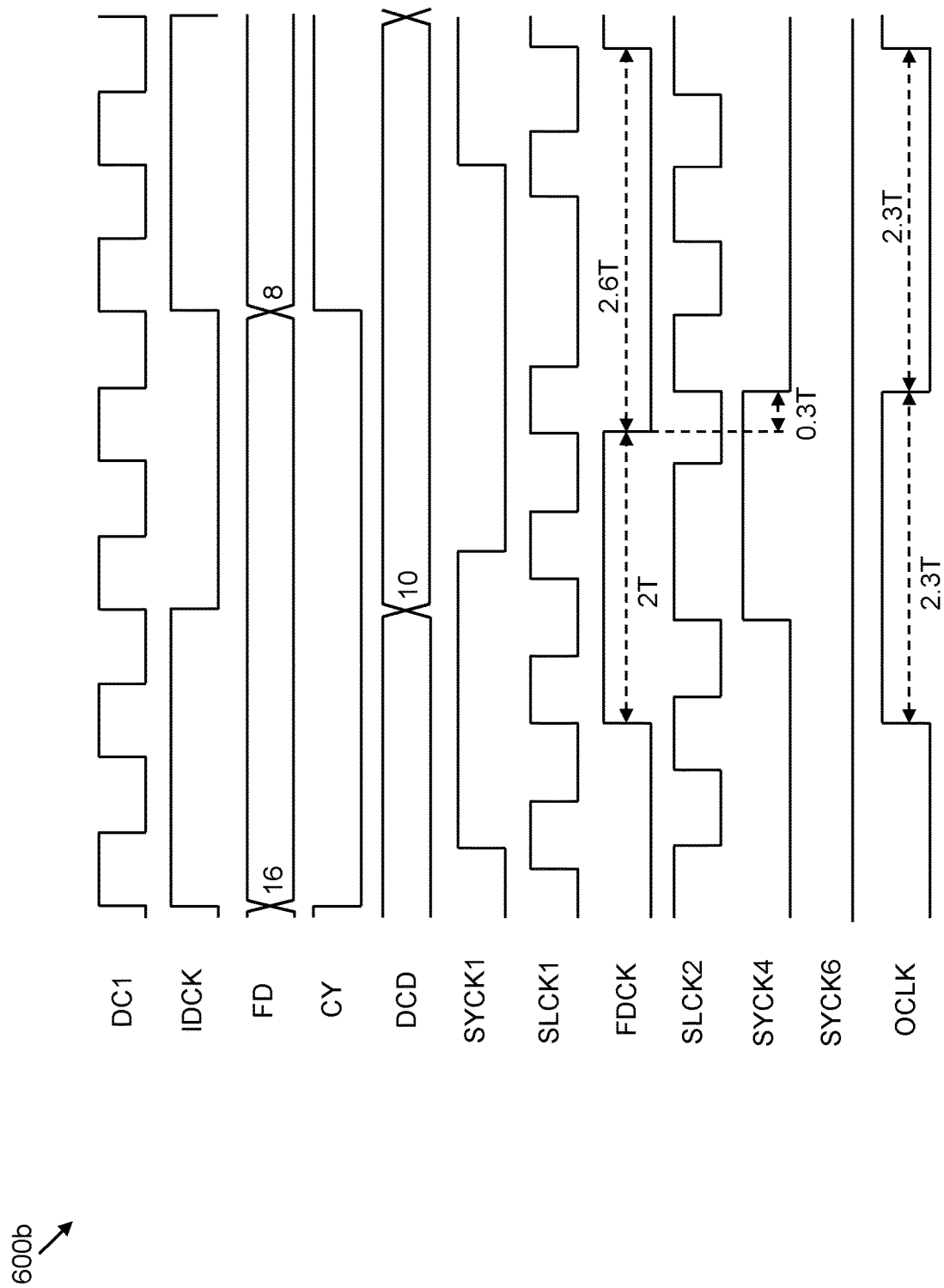

FRF>1 and ITF=Even Value:

The third timing diagram 600b illustrates a scenario where the integer factor ITF is 4 (e.g., an even value) and the fractional factor FRF is 12. The fractional value associated with the fractional division is thus 4.6. As illustrated in FIG. 6B, the frequency of the first delayed clock signal DC1 is divided by 4 to generate the integer-divided clock signal IDCK. Further, the fractional data FD is incrementing in steps of 12 and in synchronization with the rising edge of the integer-divided clock signal IDCK. Similarly, the duty cycle correction data DCD is synchronous with the falling edge of the integer-divided clock signal IDCK. The carry bit CY is asserted when the sum of the fractional data FD and the fractional factor FRF is greater than 20. The first and second selected clock signals SLCK1 and SLCK2 are controlled based on the fractional data FD and the duty cycle correction data DCD, respectively. Further, the first synchronized clock signal SYCK1 is a delayed version of the integer-divided clock signal IDCK. The first synchronized clock signal SYCK1 is sampled based on the first selected clock signal SLCK1 to generate the fractional-divided clock signal FDCK.

The fractional-divided clock signal FDCK achieves the time period of 4.6T by having the ON-time duration of 2T and the OFF-time duration of 2.6T. As the integer factor ITF is an even value, the sixth synchronized clock signal SYCK6 remains de-asserted. As the fractional factor FRF is greater than 1, the fourth synchronized clock signal SYCK4 is generated such that the falling edge of the fractional-divided clock signal FDCK is adjusted to generate the output clock signal OCLK having the ON-time duration of 2.3T and the OFF-time duration of 2.3T, thereby achieving the duty cycle equal to 50%. The generation of the half fraction (e.g., 0.6/2) at the fourth synchronized clock signal SYCK4 is facilitated by the utilization of the half fractional factor FRF/2 at the second accumulator 224.

Figure 6C:
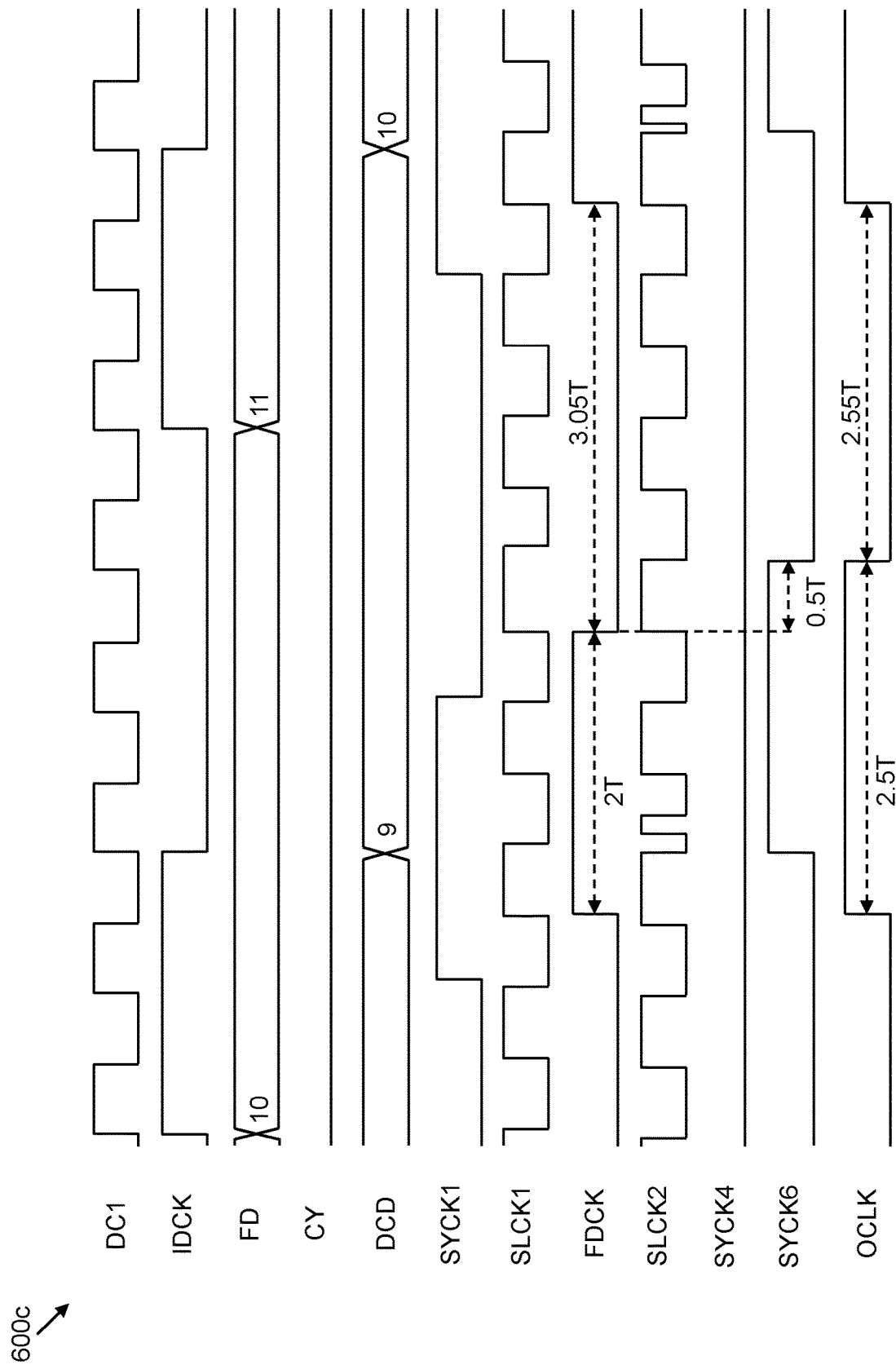

FRF=1 and ITF=Odd Value:

The fourth timing diagram 600c illustrates a scenario where the integer factor ITF is 5 (e.g., an odd value) and the fractional factor FRF is 1. The fractional value associated with the fractional division is thus 5.05. As illustrated in FIG. 6C, the frequency of the first delayed clock signal DC1 is divided by 5 to generate the integer-divided clock signal IDCK. In other words, the ON-time of the integer-divided clock signal IDCK is equal to two cycles of the first delayed clock signal DC1 and the OFF-time of the integer-divided clock signal IDCK is equal to three cycles of the first delayed clock signal DC1. Further, the fractional data FD is incrementing in steps of 1 and in synchronization with the rising edge of the integer-divided clock signal IDCK. Similarly, the duty cycle correction data DCD is synchronous with the falling edge of the integer-divided clock signal IDCK. As the values are below 20, the carry bit CY is de-asserted. The first and second selected clock signals SLCK1 and SLCK2 are controlled based on the fractional data FD and the duty cycle correction data DCD, respectively. Further, the first synchronized clock signal SYCK1 is a delayed version of the integer-divided clock signal IDCK. The first synchronized clock signal SYCK1 is sampled based on the first selected clock signal SLCK1 to generate the fractional-divided clock signal FDCK.

The fractional-divided clock signal FDCK achieves the time period of 5.05T by having the ON-time duration of 2T and the OFF-time duration of 3.05T. As the fractional factor FRF is 1, the fourth synchronized clock signal SYCK4 remains de-asserted. As the integer factor ITF is an odd value, the sixth synchronized clock signal SYCK6 is generated such that 0.5T is added to the falling edge of the fractional-divided clock signal FDCK. Thus, the output clock signal OCLK has the ON-time duration of 2.5T and the OFF-time duration of 2.55T, thereby achieving a duty cycle close to 50%.

Figure 6D:
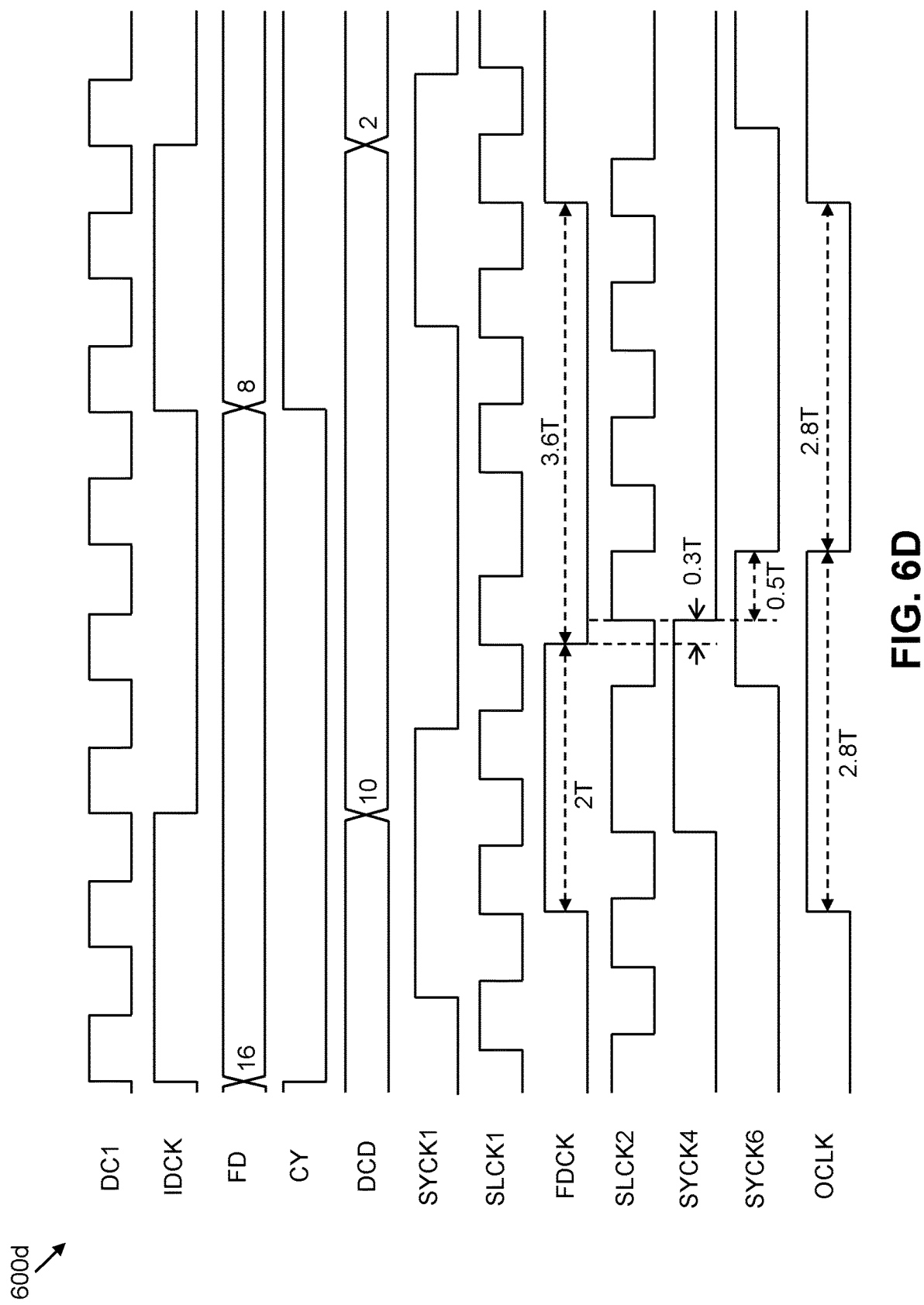

FRF>1 and ITF=Odd Value:

The fifth timing diagram 600d illustrates a scenario where the integer factor ITF is 5 (e.g., an odd value) and the fractional factor FRF is 12. The fractional value associated with the fractional division is thus 5.6. As illustrated in FIG. 6D, the frequency of the first delayed clock signal DC1 is divided by 5 to generate the integer-divided clock signal IDCK. Further, the fractional data FD is incrementing in steps of 12 and in synchronization with the rising edge of the integer-divided clock signal IDCK. Similarly, the duty cycle correction data DCD is synchronous with the falling edge of the integer-divided clock signal IDCK. The carry bit CY is asserted when the sum of the fractional data FD and the fractional factor FRF is greater than 20. The first and second selected clock signals SLCK1 and SLCK2 are controlled based on the fractional data FD and the duty cycle correction data DCD, respectively. Further, the first synchronized clock signal SYCK1 is a delayed version of the integer-divided clock signal IDCK. The first synchronized clock signal SYCK1 is sampled based on the first selected clock signal SLCK1 to generate the fractional-divided clock signal FDCK.

The fractional-divided clock signal FDCK achieves the time period of 5.6T by having the ON-time duration of 2T and the OFF-time duration of 3.6T. As the fractional factor FRF is greater than 1, the fourth synchronized clock signal SYCK4 adjusts the falling edge of the fractional-divided clock signal FDCK to the half fraction (e.g., 0.6/2) thereto. Further, as the integer factor ITF is an odd value, the sixth synchronized clock signal SYCK6 is generated such that 0.5T is added to the falling edge of the fractional-divided clock signal FDCK. The output clock signal OCLK thus has the ON-time duration of 2.8T and the OFF-time duration of 2.8T, thereby achieving a duty cycle equal to 50%.

The second through fifth timing diagrams 600a-600d are examples of the different scenarios associated with the digital frequency synthesizer 106. The scope of the present disclosure is not limited to these four timing diagrams.

Figure 7A:
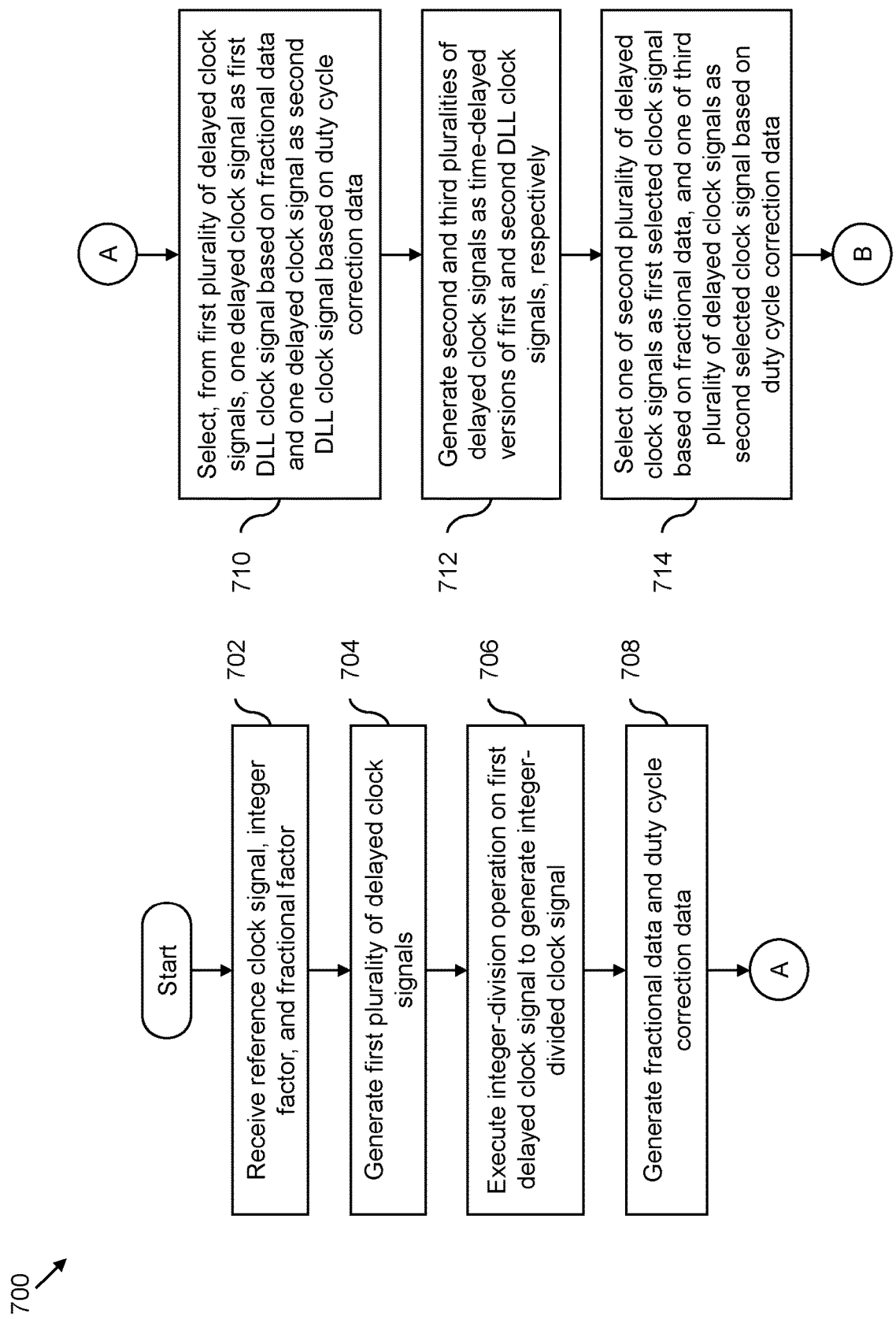

FIGS. 7A and 7B, collectively, represents a flowchart 700 that illustrates a fractional division and duty cycle correction method in accordance with an embodiment of the present disclosure. The method may be executed by the digital frequency synthesizer 106.

Referring now to FIG. 7A, at step 702, the digital frequency synthesizer 106 may receive the reference clock signal RCLK, the integer factor ITF, and the fractional factor FRF. For example, the clocking circuit 202 may receive the reference clock signal RCLK, the clock divider 204 may receive the integer factor ITF, the control circuitry 206 may receive the fractional factor FRF, and the output circuit 208 may receive the integer and fractional factors ITF and FRF. At step 704, the clocking circuit 202 (e.g., the first DLL 302) may generate the first plurality of delayed clock signals DC1-DC5. At step 706, the clock divider 204 may execute the integer-division operation on the first delayed clock signal DCI to generate the integer-divided clock signal IDCK. At step 708, the control circuitry 206 may generate the fractional data FD and the duty cycle correction data DCD based on the integer-divided clock signal IDCK and the fractional factor FRF.

At step 710, the clocking circuit 202 (e.g., the first clock selector 304) may select, from the first plurality of delayed clock signals DC1-DC5, one delayed clock signal as the first DLL clock signal DLLC1 based on the fractional data FD and the clocking circuit 202 (e.g., the third clock selector 310) may select one delayed clock signal as the second DLL clock signal DLLC2 based on the duty cycle correction data DCD. At step 712, the clocking circuit 202 (e.g., the first and second output delay chains 306 and 312) may generate the second and third pluralities of delayed clock signals DC6-DC9 and DC10-DC13 as time-delayed versions of the first and second DLL clock signals DLLC1 and DLLC2, respectively. At step 714, the clocking circuit 202 (e.g., the second clock selector 308) may select one of the second plurality of delayed clock signals DC6-DC9 as the first selected clock signal SLCK1 based on the fractional data FD and the clocking circuit 202 (e.g., the fourth clock selector 314) may select one of the third plurality of delayed clock signals DC10-DC13 as the second selected clock signal SLCK2 based on the duty cycle correction data DCD.

Referring now to FIG. 7B, at step 716, the fractional clock generator 502 may adjust the integer-divided clock signal IDCK (e.g., the rising edge of the integer-divided clock signal IDCK) based on the first selected clock signal SLCK1. At step 718, the fractional clock generator 502 may generate the fractional-divided clock signal FDCK based on the adjustment of the rising edge of the integer-divided clock signal IDCK. The fractional-divided clock signal FDCK is the fractional-divided version of the reference clock signal RCLK. At step 720, the duty cycle corrector 504 may generate, based on the fractional-divided clock signal FDCK and the second selected clock signal SLCK2, the set of correction signals (e.g., the fourth and sixth synchronized clock signals SYCK4 and SYCK6) that enables correction of the duty cycle of the fractional-divided clock signal FDCK. At step 722, the first logic gate 506 may generate the output clock signal OCLK as the logical OR of the fractional-divided clock signal FDCK and the set of correction signals.

In the present disclosure, the resolution of the digital frequency synthesizer 106 is equal to the inverse of the product of the number of delayed clock signals of the first plurality of delayed clock signals DC1-DC5 and the number of delayed clock signals of the second plurality of delayed clock signals DC6-DC9. As the first plurality of delayed clock signals DC1-DC5 include five clock signals and the second plurality of delayed clock signals DC6-DC9 include four clock signals, the resolution of the digital frequency synthesizer 106 is equal to 0.05 (e.g., 1÷20). Thus, a resolution of 0.05 may be achieved by utilizing exclusively nine clock signals (e.g., five original phases). In contrast, the conventional digital frequency synthesizer would require 20 clock signals to achieve a resolution of 0.05, as the resolution of the conventional digital frequency synthesizer is equal to an inverse of a number of VCO clock signals generated by the VCO of the conventional digital frequency synthesizer. Thus, the complexity of the digital frequency synthesizer 106 is significantly less than that of the conventional digital frequency synthesizer. Further, the digital frequency synthesizer 106 utilizes DLL and delay chain to generate the clock signals, whereas, the conventional digital frequency synthesizer utilizes a ring oscillator. Thus, the dynamic power consumption of the digital frequency synthesizer 106 is significantly less than that of the conventional digital frequency synthesizer.

In the present disclosure, the term "assert" is used to mean placing a signal in an active state. For example, for an active-low signal, the signal is at a logic-low state when asserted, and for an active-high signal, the signal is at a logic-high state when asserted. In an embodiment of the present disclosure, the IC 100 is disclosed. The IC 100 may include the digital frequency synthesizer 106. Further, the digital frequency synthesizer 106 may include the first DLL 302, the clock divider 204, and the control circuitry 206. The first DLL 302 may be configured to receive the reference clock signal RCLK and generate the first plurality of delayed clock signals DC1-DC5 that are time-delayed versions of the reference clock signal RCLK. The clock divider 204 may be configured to execute the integer-division operation on the first delayed clock signal DC1 to generate the integer-divided clock signal IDCK. The control circuitry 206 may be configured to generate the fractional data FD based on the integer-divided clock signal IDCK. The fractional data FD may enable the fractional division associated with the digital frequency synthesizer 106. The digital frequency synthesizer 106 may further include the first clock selector 304, the first output delay chain 306, the second clock selector 308, and the fractional clock generator 502. The first clock selector 304 may be configured to select one of the first plurality of delayed clock signals DC1-DC5 as the first DLL clock signal DLLC1 based on the fractional data FD. Further, the first output delay chain 306 may be configured to generate the second plurality of delayed clock signals DC6-DC9 that are time-delayed versions of the first DLL clock signal DLLC1. The second clock selector 308 may be configured to select one of the second plurality of delayed clock signals DC6-DC9 as the first selected clock signal SLCK1 based on the fractional data FD. The fractional clock generator 502 may be configured to adjust the integer-divided clock signal IDCK based on the first selected clock signal SLCK1 and generate the fractional-divided clock signal FDCK that is the fractional-divided version of the reference clock signal RCLK.

In another embodiment of the present disclosure, the fractional division and duty cycle correction method is disclosed. The method may include receiving the reference clock signal RCLK and generating the first plurality of delayed clock signals DC1-DC5 by the first DLL 302. The first plurality of delayed clock signals DC1-DC5 may be time-delayed versions of the reference clock signal RCLK. Further, the method may include executing the integer-division operation on the first delayed clock signal DC1 by the clock divider 204 to generate the integer-divided clock signal IDCK. Additionally, the method may include generating the fractional data FD by the control circuitry 206 based on the integer-divided clock signal IDCK. The fractional data FD enables the fractional division associated with the digital frequency synthesizer 106. Further, the method may include selecting one of the first plurality of delayed clock signals DC1-DC5 as the first DLL clock signal DLLC1 based on the fractional data FD by the first clock selector 304 and generating the second plurality of delayed clock signals DC6-DC9 that are time-delayed versions of the first DLL clock signal DLLC1 by the first output delay chain 306. Further, the method may include selecting one of the second plurality of delayed clock signals DC6-DC9 as the first selected clock signal SLCK1 based on the fractional data FD by the second clock selector 308. The method may further include adjusting the integer-divided clock signal IDCK based on the first selected clock signal SLCK1 and generating the fractional-divided clock signal FDCK by the fractional clock generator 502. The fractional-divided clock signal FDCK is the fractional-divided version of the reference clock signal RCLK.

In some embodiments, the first DLL 302 may further include the first DLL delay chain 318 configured to receive the reference clock signal RCLK and the first control voltage VC1. The first DLL delay chain 318 may generate the first plurality of delayed clock signals DC1-DC5 based on the reference clock signal RCLK and the first control voltage VC1. Further, the first DLL delay chain 318 may include the first plurality of series-coupled delay elements configured to generate the first plurality of delayed clock signals DC1-DC5 such that the delay introduced by each delay element is identical. Additionally, the first DLL 302 may include the first DLL control circuit 320 configured to generate the first control voltage VC1 based on the delay between the reference clock signal RCLK and the last delayed clock signal of the first plurality of delayed clock signals DC1-DC5 (e.g., the fifth delayed clock signal DC5). Based on the first DLL 302 operating in the locked state, the delay between the reference clock signal RCLK and the fifth delayed clock signal DC5 is equal to the time period of the reference clock signal RCLK.

In some embodiments, the first output delay chain 306 may include the second plurality of series-coupled delay elements that may be configured to generate the second plurality of delayed clock signals DC6-DC9 such that the delay introduced by each delay element is identical. Further, each delay element of the second plurality of series-coupled delay elements may be configured to receive the second control voltage VC2 that controls the delay introduced by the corresponding delay element. Additionally, the second control voltage VC2 may be such that the delay between the first DLL clock signal DLLC1 and the last delayed clock signal of the second plurality of delayed clock signals DC6-DC9 (e.g., the ninth delayed clock signal DC9) is equal to the time period of the reference clock signal RCLK.

In some embodiments, the frequency of the fractional-divided clock signal FDCK may be equal to the frequency of the reference clock signal RCLK divided by the fractional value associated with the fractional division. The fractional value may be equal to the sum of the integer factor ITF and the product of the fractional factor FRF and the resolution of the digital frequency synthesizer 106.

In some embodiments, the resolution of the digital frequency synthesizer 106 may be equal to the inverse of the product of the number of delayed clock signals of the first plurality of delayed clock signals DC1-DC5 and the number of delayed clock signals of the second plurality of delayed clock signals DC6-DC9.

In some embodiments, the execution of the integer-division operation on the first delayed clock signal DC1 corresponds to the division of the frequency of the first delayed clock signal DC1 by the integer factor ITF.

In some embodiments, the control circuitry 206 may further include the first accumulator 212, the first modulo circuit 214, the first synchronizer 216, and the second synchronizer 218. The first accumulator 212 may be configured to generate the first accumulated data ACM1 based on the fractional factor FRF and the feedback data FB. The first modulo circuit 214 may be configured to execute the first modulo operation on the first accumulated data ACM1 and generate the first remainder value RM1. The divisor of the first modulo operation may correspond to the inverse of the resolution of the digital frequency synthesizer 106. The first synchronizer 216 may be configured to sample the first remainder value RM1 based on the integer-divided clock signal IDCK to generate the feedback data FB. The second synchronizer 218 may be configured to sample the feedback data FB based on the integer-divided clock signal IDCK to generate the fractional data FD.

In some embodiments, the control circuitry 206 may further include the quotient generator 220 and the third synchronizer 222. The quotient generator 220 may be configured to divide the first accumulated data ACM1 by the inverse of the resolution of the digital frequency synthesizer 106 and generate the quotient value QU. The third synchronizer 222 may be configured to sample the quotient value QU based on the integer-divided clock signal IDCK to generate the carry bit CY. Further, the execution of the integer-division operation on the first delayed clock signal DC1 may correspond to the division of the frequency of the first delayed clock signal DC1 by the sum of the integer factor ITF and the carry bit CY.

In some embodiments, the control circuitry 206 may further include the second accumulator 224, the second modulo circuit 226, the fourth synchronizer 228, and the fifth synchronizer 230. The second accumulator 224 may be configured to generate the second accumulated data ACM2 based on the feedback data FB and the right-shifted version of the fractional factor FRF (e.g., the half fractional factor FRF/2). The second modulo circuit 226 may be configured to execute the second modulo operation on the second accumulated data ACM2 and generate the second remainder value RM2. The divisor of the second modulo operation may correspond to the inverse of the resolution of the digital frequency synthesizer 106. The fourth synchronizer 228 may be configured to sample the second remainder value RM2 based on the integer-divided clock signal IDCK to generate the intermediate data IM. The fifth synchronizer 230 may be configured to sample the intermediate data IM based on the inverted integer-divided clock signal IIDCK to generate the duty cycle correction data DCD. The duty cycle correction data DCD may enable the duty cycle correction associated with the digital frequency synthesizer 106

In some embodiments, the fractional clock generator 502 may include the sixth synchronizer 508 that may be configured to receive the first selected clock signal SLCK1 and the first synchronized clock signal SYCK1 that is derived from the integer-divided clock signal IDCK. Further, the sixth synchronizer 508 may be configured to sample the first synchronized clock signal SYCK1 based on the first selected clock signal SLCK1 to generate the fractional-divided clock signal FDCK. The sampling of the first synchronized clock signal SYCK1 may result in the rising edge of the first synchronized clock signal SYCK1 being adjusted. The rising edge of the first synchronized clock signal SYCK1 may be adjusted such that the frequency of the fractional-divided clock signal FDCK is equal to the frequency of the reference clock signal RCLK divided by the fractional value associated with the fractional division.

In some embodiments, the fractional clock generator 502 may further include the seventh synchronizer 510, the eighth synchronizer 512, and the multiplexer 514. The seventh synchronizer 510 may be configured to sample the integer-divided clock signal IDCK based on the first delayed clock signal DC1 to generate the second synchronized clock signal SYCK2. The eighth synchronizer 512 may be configured to sample the integer-divided clock signal IDCK based on one of the first plurality of delayed clock signals DC1-DC5, that is different from the first delayed clock signal DC1, to generate the third synchronized clock signal SYCK3. The multiplexer 514 may be configured to generate the first synchronized clock signal SYCK1 based on the select signal SS, the second synchronized clock signal SYCK2, and the third synchronized clock signal SYCK3. The select signal SS may be asserted based on the product of the fractional factor FRF and the resolution of the digital frequency synthesizer 106 being greater than the first predefined value and de-asserted based on the product of the fractional factor FRF and the resolution of the digital frequency synthesizer 106 being less than or equal to the first predefined value. Based on the assertion of the select signal SS, the first synchronized clock signal SYCK1 may be same as the second synchronized clock signal SYCK2. Further, based on the de-assertion of the select signal SS, the first synchronized clock signal SYCK1 may be same as the third synchronized clock signal SYCK3.

In some embodiments, the product of the fractional factor FRF and the resolution of the digital frequency synthesizer 106 may be a decimal value that ranges between zero and one. Further, the first predefined value may correspond to 0.5.

In some embodiments, the digital frequency synthesizer 106 may further include the third clock selector 310, the second output delay chain 312, the fourth clock selector 314, and the duty cycle corrector 504. The third clock selector 310 may be configured to select one of the first plurality of delayed clock signals DC1-DC5 as the second DLL clock signal DLLC2 based on the duty cycle correction data DCD. The control circuitry 206 may be further configured to generate, based on the integer-divided clock signal IDCK, the duty cycle correction data DCD that enables the duty cycle correction associated with the digital frequency synthesizer 106. The second output delay chain 312 may be configured to generate the third plurality of delayed clock signals DC10-DC13 that are time-delayed versions of the second DLL clock signal DLLC2. The fourth clock selector 314 may be configured to select one of the third plurality of delayed clock signals DC10-DC13 as the second selected clock signal SLCK2 based on the duty cycle correction data DCD. The duty cycle corrector 504 may be configured to generate, based on the fractional-divided clock signal FDCK and the second selected clock signal SLCK2, the set of correction signals that enables correction of the duty cycle of the fractional-divided clock signal FDCK. The output clock signal OCLK may be generated based on the fractional-divided clock signal FDCK and the set of correction signals. The output clock signal OCLK may correspond to the fractional-divided clock signal FDCK with the duty cycle thereof adjusted based on the second selected clock signal SLCK2.

In some embodiments, the second output delay chain 312 may include the third plurality of series-coupled delay elements configured to generate the third plurality of delayed clock signals DC10-DC13. The third plurality of delayed clock signals DC10-DC13 may be generated such that the delay introduced by each delay element of the third plurality of series-coupled delay elements is identical. Further, each delay element of the third plurality of series-coupled delay elements may be configured to receive the second control voltage VC2 that may control the delay introduced by the corresponding delay element. The second control voltage VC2 may be such that the delay between the second DLL clock signal DLLC2 and the last delayed clock signal of the third plurality of delayed clock signals DC10-DC13 (e.g., the thirteenth delayed clock signal DC13) is equal to the time period of the reference clock signal RCLK.

In some embodiments, the digital frequency synthesizer 106 may further include the second DLL 316. The second DLL 316 may include the second DLL delay chain 324 and the second DLL control circuit 326. The second DLL delay chain 324 may be configured to receive the reference clock signal RCLK and the second control voltage VC2 and generate the fourth plurality of delayed clock signals DC14-DC17 based on the reference clock signal RCLK and the second control voltage VC2. The fourth plurality of delayed clock signals DC14-DC17 may be time-delayed versions of the reference clock signal RCLK. The second DLL delay chain 324 may include the fourth plurality of series-coupled delay elements configured to generate the fourth plurality of delayed clock signals DC14-DC17 such that the delay introduced by each delay element is identical. The second DLL control circuit 326 may be configured to generate the second control voltage VC2 based on the delay between the reference clock signal RCLK and the last delayed clock signal of the fourth plurality of delayed clock signals DC14-DC17 (e.g., the seventeenth delayed clock signal DC17). Based on the second DLL 316 operating in the locked state, the delay between the reference clock signal RCLK and the seventeenth delayed clock signal DC17 is equal to the time period of the reference clock signal RCLK. Further, based on the second DLL 316 operating in the locked state, the delay between the first DLL clock signal DLLC1 and the ninth delayed clock signal DC9 is equal to the time period of the reference clock signal RCLK. Additionally, based on the second DLL 316 operating in the locked state, the delay between the second DLL clock signal DLLC2 and the thirteenth delayed clock signal DC13 is equal to the time period of the reference clock signal RCLK.

In some embodiments, the duty cycle corrector 504 may further include the ninth synchronizer 518, the tenth synchronizer 520, and the eleventh synchronizer 522. The ninth synchronizer 518 may be configured to sample the fractional-divided clock signal FDCK based on the second selected clock signal SLCK2 and the fractional factor FRF to generate the fourth synchronized clock signal SYCK4. The tenth synchronizer 520 may be configured to sample the fractional-divided clock signal FDCK based on the second selected clock signal SLCK2 to generate the fifth synchronized clock signal SYCK5. The eleventh synchronizer 522 may be configured to sample the fifth synchronized clock signal SYCK5 based on the inverted second selected clock signal ISLCK2 and the integer factor ITF to generate the sixth synchronized clock signal SYCK6. The set of correction signals may include the fourth synchronized clock signal SYCK4 and the sixth synchronized clock signal SYCK6.

In some embodiments, the digital frequency synthesizer 106 may further include the first logic gate 506. The first logic gate 506 may be configured to generate the output clock signal OCLK based on the fractional-divided clock signal FDCK, the fourth synchronized clock signal SYCK4, and the sixth synchronized clock signal SYCK6. The output clock signal OCLK may be asserted based on the assertion of at least one of the fractional-divided clock signal FDCK, the fourth synchronized clock signal SYCK4, and the sixth synchronized clock signal SYCK6. Further, the output clock signal OCLK may be de-asserted based on the de-assertion of the fractional-divided clock signal FDCK, the fourth synchronized clock signal SYCK4, and the sixth synchronized clock signal SYCK6.

In some embodiments, the ninth synchronizer 518 may be activated based on the fractional factor FRF being greater than the second predefined value and deactivated based on the fractional factor FRF being less than or equal to the second predefined value.

In some embodiments, the eleventh synchronizer 522 may be activated based on the integer factor ITF being the odd value. 5

While various embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims. Further, unless stated otherwise, terms such as "first" and "second" are used to arbitrarily distinguish between the elements such terms describe. Thus, these terms are not necessarily intended to indicate temporal or other prioritization of such elements.

We claim:
1. An integrated circuit (IC), comprising:
 a digital frequency synthesizer that comprises:
  a first delay-locked loop (DLL) configured to receive a reference clock signal and generate a first plurality of delayed clock signals that are time-delayed versions of the reference clock signal;
  a clock divider configured to execute an integer-division operation on a first delayed clock signal of the first plurality of delayed clock signals to generate an integer-divided clock signal;
  control circuitry configured to generate, based on the integer-divided clock signal, fractional data that enables a fractional division associated with the digital frequency synthesizer;
  a first clock selector configured to select, based on the fractional data, one of the first plurality of delayed clock signals as a first DLL clock signal;
  a first output delay chain configured to generate a second plurality of delayed clock signals that are time-delayed versions of the first DLL clock signal;
  a second clock selector configured to select, based on the fractional data, one of the second plurality of delayed clock signals as a first selected clock signal; and
  a fractional clock generator configured to adjust the integer-divided clock signal based on the first selected clock signal and generate a fractional-divided clock signal that is a fractional-divided version of the reference clock signal.

2. The IC of claim 1, wherein the first DLL comprises:
 a first DLL delay chain configured to receive the reference clock signal and a first control voltage and generate the first plurality of delayed clock signals based on the reference clock signal and the first control voltage, wherein the first DLL delay chain comprises a first plurality of series-coupled delay elements configured to generate the first plurality of delayed clock signals such that a delay introduced by each delay element is identical; and
 a first DLL control circuit configured to generate the first control voltage based on a delay between the reference clock signal and a last delayed clock signal of the first plurality of delayed clock signals, wherein based on the first DLL operating in a locked state, the delay between the reference clock signal and the last delayed clock signal of the first plurality of delayed clock signals is equal to a time period of the reference clock signal.

3. The IC of claim 1,
 wherein the first output delay chain comprises a second plurality of series-coupled delay elements configured to generate the second plurality of delayed clock signals such that a delay introduced by each delay element of the second plurality of series-coupled delay elements is identical,
 wherein each delay element of the second plurality of series-coupled delay elements is configured to receive a second control voltage that controls the delay introduced by the corresponding delay element, and
 wherein the second control voltage is such that a delay between the first DLL clock signal and a last delayed clock signal of the second plurality of delayed clock signals is equal to a time period of the reference clock signal.

4. The IC of claim 1, wherein a frequency of the fractional-divided clock signal is equal to a frequency of the reference clock signal divided by a fractional value associated with the fractional division, and wherein the fractional value is equal to a sum of (i) an integer factor and (ii) a product of a fractional factor and a resolution of the digital frequency synthesizer.

5. The IC of claim 4, wherein the resolution of the digital frequency synthesizer is equal to an inverse of a product of a number of delayed clock signals of the first plurality of delayed clock signals and a number of delayed clock signals of the second plurality of delayed clock signals.

6. The IC of claim 4, wherein the execution of the integer-division operation on the first delayed clock signal corresponds to a division of a frequency of the first delayed clock signal by the integer factor.

7. The IC of claim 4, wherein the control circuitry comprises:
 a first accumulator configured to generate first accumulated data based on the fractional factor and feedback data;
 a first modulo circuit configured to execute a first modulo operation on the first accumulated data and generate a first remainder value, wherein a divisor of the first modulo operation corresponds to an inverse of the resolution of the digital frequency synthesizer;
 a first synchronizer configured to sample the first remainder value based on the integer-divided clock signal to generate the feedback data; and
 a second synchronizer configured to sample the feedback data based on the integer-divided clock signal to generate the fractional data.

8. The IC of claim 7, wherein the control circuitry further comprises:
 a quotient generator configured to divide the first accumulated data by the inverse of the resolution of the digital frequency synthesizer and generate a quotient value; and
 a third synchronizer configured to sample the quotient value based on the integer-divided clock signal to generate a carry bit, wherein the execution of the integer-division operation on the first delayed clock signal corresponds to a division of a frequency of the first delayed clock signal by a sum of the integer factor and the carry bit.

9. The IC of claim 7, wherein the control circuitry further comprises:
 a second accumulator configured to generate second accumulated data based on the feedback data and a right-shifted version of the fractional factor;
 a second modulo circuit configured to execute a second modulo operation on the second accumulated data and generate a second remainder value, wherein a divisor of the second modulo operation corresponds to the inverse of the resolution of the digital frequency synthesizer;
 a fourth synchronizer configured to sample the second remainder value based on the integer-divided clock signal to generate intermediate data; and
 a fifth synchronizer configured to sample the intermediate data based on an inverted version of the integer-divided clock signal to generate duty cycle correction data, wherein the duty cycle correction data enables a duty cycle correction associated with the digital frequency synthesizer.

10. The IC of claim 4, wherein the fractional clock generator comprises a sixth synchronizer configured to receive a first synchronized clock signal that is derived from the integer-divided clock signal and sample the first synchronized clock signal based on the first selected clock signal to generate the fractional-divided clock signal, wherein the sampling of the first synchronized clock signal based on the first selected clock signal results in a rising edge of the first synchronized clock signal being adjusted, and wherein the rising edge of the first synchronized clock signal is adjusted such that the frequency of the fractional-divided clock signal is equal to the frequency of the reference clock signal divided by the fractional value associated with the fractional division.

11. The IC of claim 10, wherein the fractional clock generator further comprises
 a seventh synchronizer configured to sample the integer-divided clock signal based on the first delayed clock signal to generate a second synchronized clock signal;
 an eighth synchronizer configured to sample the integer-divided clock signal based on one of the first plurality of delayed clock signals, that is different from the first delayed clock signal, to generate a third synchronized clock signal; and
 a multiplexer configured to generate the first synchronized clock signal based on a select signal, the second synchronized clock signal, and the third synchronized clock signal, wherein the select signal is asserted based on the product of the fractional factor and the resolution of the digital frequency synthesizer being greater than a first predefined value and de-asserted based on the product of the fractional factor and the resolution of the digital frequency synthesizer being less than or equal to the first predefined value, and wherein based on the assertion of the select signal, the first synchronized clock signal is same as the second synchronized clock signal and based on the de-assertion of the select signal, the first synchronized clock signal is same as the third synchronized clock signal.

12. The IC of claim 11, wherein the product of the fractional factor and the resolution of the digital frequency synthesizer is a decimal value that ranges between zero and one, and wherein the first predefined value corresponds to 0.5.

13. The IC of claim 1, wherein the digital frequency synthesizer further comprises:
 a third clock selector configured to select, based on duty cycle correction data, one of the first plurality of delayed clock signals as a second DLL clock signal, wherein the control circuitry is further configured to generate, based on the integer-divided clock signal, the duty cycle correction data that enables a duty cycle correction associated with the digital frequency synthesizer;
 a second output delay chain configured to generate a third plurality of delayed clock signals that are time-delayed versions of the second DLL clock signal;
 a fourth clock selector configured to select, based on the duty cycle correction data, one of the third plurality of delayed clock signals as a second selected clock signal; and
 a duty cycle corrector configured to generate, based on the fractional-divided clock signal and the second selected clock signal, a set of correction signals that enables correction of a duty cycle of the fractional-divided clock signal, wherein an output clock signal of the digital frequency synthesizer is generated based on the fractional-divided clock signal and the set of correction signals, and wherein the output clock signal corresponds to the fractional-divided clock signal with the duty cycle thereof adjusted based on the second selected clock signal.

14. The IC of claim 13,
wherein the second output delay chain comprises a third plurality of series-coupled delay elements configured to generate the third plurality of delayed clock signals such that a delay introduced by each delay element of the third plurality of series-coupled delay elements is identical,
wherein each delay element of the third plurality of series-coupled delay elements is configured to receive a second control voltage that controls the delay introduced by the corresponding delay element, and
wherein the second control voltage is such that a delay between the second DLL clock signal and a last delayed clock signal of the third plurality of delayed clock signals is equal to a time period of the reference clock signal.

15. The IC of claim 13, wherein the digital frequency synthesizer further comprises a second DLL that comprises:
a second DLL delay chain configured to receive the reference clock signal and a second control voltage and generate a fourth plurality of delayed clock signals based on the reference clock signal and the second control voltage, wherein the fourth plurality of delayed clock signals are time-delayed versions of the reference clock signal, and wherein the second DLL delay chain comprises a fourth plurality of series-coupled delay elements configured to generate the fourth plurality of delayed clock signals such that a delay introduced by each delay element is identical; and
a second DLL control circuit configured to generate the second control voltage based on a delay between the reference clock signal and a last delayed clock signal of the fourth plurality of delayed clock signals, wherein based on the second DLL operating in a locked state, (i) the delay between the reference clock signal and the last delayed clock signal of the fourth plurality of delayed clock signals is equal to a time period of the reference clock signal, (ii) a delay between the first DLL clock signal and a last delayed clock signal of the second plurality of delayed clock signals is equal to the time period of the reference clock signal, and (iii) a delay between the second DLL clock signal and a last delayed clock signal of the third plurality of delayed clock signals is equal to the time period of the reference clock signal.

16. The IC of claim 13, wherein the duty cycle corrector comprises:
a ninth synchronizer configured to sample the fractional-divided clock signal based on the second selected clock signal and a fractional factor to generate a fourth synchronized clock signal, wherein a frequency of the fractional-divided clock signal is equal to a frequency of the reference clock signal divided by a fractional value associated with the fractional division, and wherein the fractional value associated with the fractional division is equal to a sum of (i) an integer factor and (ii) the product of the fractional factor and a resolution of the digital frequency synthesizer;
a tenth synchronizer configured to sample the fractional-divided clock signal based on the second selected clock signal to generate a fifth synchronized clock signal; and
an eleventh synchronizer configured to sample the fifth synchronized clock signal based on an inverted version of the second selected clock signal and the integer factor to generate a sixth synchronized clock signal, wherein the set of correction signals comprises the fourth synchronized clock signal and the sixth synchronized clock signal.

17. The IC of claim 16, wherein the digital frequency synthesizer further comprises a logic gate configured to generate the output clock signal based on the fractional-divided clock signal, the fourth synchronized clock signal, and the sixth synchronized clock signal, and wherein the output clock signal is asserted based on assertion of at least one of the fractional-divided clock signal, the fourth synchronized clock signal, and the sixth synchronized clock signal, and the output clock signal is de-asserted based on de-assertion of the fractional-divided clock signal, the fourth synchronized clock signal, and the sixth synchronized clock signal.

18. The IC of claim 16, wherein the ninth synchronizer is activated based on the fractional factor being greater than a second predefined value and deactivated based on the fractional factor being less than or equal to the second predefined value.

19. The IC of claim 16, wherein the eleventh synchronizer is activated based on the integer factor being an odd value.

20. A method, comprising:
receiving, by a first delay-locked loop (DLL) of a digital frequency synthesizer, a reference clock signal;
generating, by the first DLL, a first plurality of delayed clock signals that are time-delayed versions of the reference clock signal;
executing, by a clock divider of the digital frequency synthesizer, an integer-division operation on a first delayed clock signal of the first plurality of delayed clock signals to generate an integer-divided clock signal;
generating, by control circuitry of the digital frequency synthesizer, based on the integer-divided clock signal, fractional data that enables a fractional division associated with the digital frequency synthesizer;
selecting, by a first clock selector of the digital frequency synthesizer, based on the fractional data, one of the first plurality of delayed clock signals as a first DLL clock signal;
generating, by a first output delay chain of the digital frequency synthesizer, a second plurality of delayed clock signals that are time-delayed versions of the first DLL clock signal;
selecting, by a second clock selector of the digital frequency synthesizer, based on the fractional data, one of the second plurality of delayed clock signals as a first selected clock signal;
adjusting, by a fractional clock generator of the digital frequency synthesizer, the integer-divided clock signal based on the first selected clock signal; and
generating, by the fractional clock generator, a fractional-divided clock signal that is a fractional-divided version of the reference clock signal.

* * * * *